(12) United States Patent
Cai

(10) Patent No.: US 11,747,410 B2
(45) Date of Patent: Sep. 5, 2023

(54) MAGNETIC SENSOR DEVICE WITH A MAGNETIC FIELD CONVERTER, A MAGNETIC DETECTOR, AND A MAGNETIC SHIELD

(71) Applicant: TDK Corporation, Tokyo (JP)

(72) Inventor: Yongfu Cai, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 17/034,370

(22) Filed: Sep. 28, 2020

(65) Prior Publication Data
US 2021/0096196 A1    Apr. 1, 2021

(30) Foreign Application Priority Data

Oct. 1, 2019  (JP) .................................. 2019-181746

(51) Int. Cl.
*G01R 33/09*  (2006.01)
*G01D 5/14*   (2006.01)

(52) U.S. Cl.
CPC ........... *G01R 33/098* (2013.01); *G01D 5/145* (2013.01)

(58) Field of Classification Search
CPC ........ G01R 1/02; G01R 1/18; G01R 33/0011; G01R 33/007; G01R 33/0076;
(Continued)

(56) References Cited

U.S. PATENT DOCUMENTS 4,367,449 A * 1/1983 Veisz .................... H01F 7/08
                                                335/229
5,187,327 A * 2/1993 Ohta .................... H05K 9/0077
                                                174/391
(Continued)

FOREIGN PATENT DOCUMENTS

JP       2003-28605 A      1/2003
JP       2015-129697 A     7/2015
(Continued)

OTHER PUBLICATIONS

English machine translation of Japanese Office Action dated May 31, 2022 issued in corresponding JP Patent Application No. 2019-181746.

*Primary Examiner* — Huy Q Phan
*Assistant Examiner* — David B Frederiksen
(74) *Attorney, Agent, or Firm* — Posz Law Group, PLC

(57) ABSTRACT

A magnetic sensor device includes a magnetic field converter that receives an input magnetic field input along a first direction and outputs an output magnetic field along a second direction, which is orthogonal to the first direction. A magnetic field detector is provided at a position where the output magnetic field is applied. A magnetic shield shields external magnetic fields along a third direction, which is orthogonal to both the first direction and the second direction. When viewed along the first direction, the magnetic field converter has a shape such that the length in the third direction is greater than the length in the second direction. When viewed along the first direction, the magnetic shield is provided at a position overlapping the magnetic field converter and the magnetic field detector, and the magnetic field transmittance of the external magnetic field is 1-30%.

10 Claims, 13 Drawing Sheets

(58) Field of Classification Search
CPC ........ G01R 33/0094; G01R 33/09–098; G01D 5/14; G01D 5/142; G01D 5/145; G01D 5/16
See application file for complete search history.

(56) References Cited

U.S. PATENT DOCUMENTS

| | | | |
|---|---|---|---|
| 6,462,540 B1* | 10/2002 | Kandori | G01R 33/0354 324/225 |
| 7,356,909 B1* | 4/2008 | Min | G01R 33/093 29/603.16 |
| 9,451,734 B2* | 9/2016 | Onuma | G01R 33/0076 |
| 2003/0016010 A1* | 1/2003 | Kandori | A61B 5/242 600/409 |
| 2004/0263162 A1* | 12/2004 | Kandori | G01R 33/0354 324/248 |
| 2013/0335076 A1* | 12/2013 | Sakamoto | G01R 15/207 324/244 |
| 2015/0069846 A1* | 3/2015 | Hokari | G01R 1/18 307/91 |
| 2015/0137804 A1* | 5/2015 | Yuan | G01R 33/0011 216/22 |
| 2015/0192432 A1 | 7/2015 | Noguchi et al. | |
| 2017/0097394 A1* | 4/2017 | Bickford | G01L 3/00 |
| 2017/0100051 A1* | 4/2017 | Hon | A61B 5/242 |
| 2018/0003776 A1* | 1/2018 | Suess | G01R 33/0011 |
| 2018/0113176 A1 | 4/2018 | Nagata et al. | |
| 2018/0275217 A1* | 9/2018 | Uchida | G01R 33/091 |
| 2019/0041473 A1 | 2/2019 | Tanabe | |
| 2019/0056459 A1 | 2/2019 | Uchida et al. | |
| 2019/0277890 A1* | 9/2019 | Esaka | G01R 15/20 |
| 2020/0003852 A1* | 1/2020 | Ogomi | G01R 33/0011 |
| 2020/0041580 A1* | 2/2020 | Yuan | H01L 43/08 |

FOREIGN PATENT DOCUMENTS

| | | |
|---|---|---|
| JP | 2017-167021 A | 9/2017 |
| JP | 2018-72026 A | 5/2018 |
| JP | 2019-35686 A | 3/2019 |

\* cited by examiner

MAGNETIC SENSOR DEVICE WITH A MAGNETIC FIELD CONVERTER, A MAGNETIC DETECTOR, AND A MAGNETIC SHIELD

The present application is based on and claims priority from Japanese Patent Application No. 2019-181746 filed on Oct. 1, 2019, the disclosure of which is incorporated herein by reference.

TECHNICAL FIELD

The present invention relates to a magnetic sensor device.

BACKGROUND

In recent years, in a variety of applications, physical quantity detection devices (position detection devices) for detecting physical quantities (for example, position and movement amount (change amounts) or the like caused by rotational movement or linear movement of a moving body) have been used. As such a physical quantity detection device, one equipped with a magnetic sensor capable of detecting change in an external magnetic field and a magnetic field generator (for example, a magnet) the position of which relative to the magnetic sensor can be caused to change, has been known, and a sensor signal in accordance with the change in the external magnetic field is output from the magnetic sensor.

As the magnetic sensor element, one in which a magnetic sensor element for detecting the detected magnetic field is provided on a substrate is known. As such a magnetic sensor element, a magnetoresistive effect element (GMR element, TMR element or the like) in which resistance changes in accordance with change in the external magnetic field, or the like is used.

A magnetoresistive effect element is composed of a layered structure including at least a free layer, the magnetization direction of which can change in accordance with an external magnetic field, a magnetization fixed layer, the magnetization direction of which is fixed, and a nonmagnetic layer, which is interposed between the free layer and the magnetization fixed layer. In a magnetoresistive effect element having this kind of structure, the resistance value of the magnetoresistive effect element is determined by the angle formed by the magnetization direction of the free layer and the magnetization direction of the magnetization fixed layer. In addition, the magnetization direction of the free layer changes in accordance with the external magnetic field, and the angle formed by the magnetization directions of the free layer and the magnetization fixed layer changes because of this. Accordingly, the resistance value of the magnetoresistive effect element changes. Through the change in this resistance value, a sensor signal corresponding to the change in the external magnetic field is output. The magnetoresistive effect element provided on a substrate is often configured to have sensitivity with respect to a magnetic field in a direction parallel to the surface of the substrate.

On the other hand, with a magnetic sensor, there is also a desire to detect a magnetic field in a direction perpendicular to the surface of the substrate by means of the magnetoresistive effect element provided on the substrate (see Patent Literature 1). As the above-described magnetic sensor, one that is used to detect the position of a magnet is used. In this magnetic sensor, a magnet is provided above the substrate on which the magnetoresistive effect element is provided, and a soft magnetic material is provided between the magnet and the magnetoresistive effect element. This soft magnetic material converts the perpendicular magnetic field component in a direction perpendicular to the substrate surface, of the components of the magnetic field generated by the magnet, into a magnetic field component that is parallel to the substrate surface to which the magnetoresistive effect element has sensitivity, and the converted magnetic field component is applied to the magnetoresistive effect element.

RELATED LITERATURE

Patent Literature

[PATENT LITERATURE 1] JP Laid-Open Patent Application No. 2015-129697

OVERVIEW OF THE INVENTION

Problem to be Solved by the Invention

In the above-described magnetic sensor, the strength and direction of the magnetic field generated from the magnet and applied to the magnetoresistive effect element are determined by the length (i.e., gap) between the magnet and the magnetoresistive effect element. During assembly of the above-described magnetic sensor, there are times when variations arise in the above-described gap, so there are times when a magnetic field of the designed strength and direction is not applied to the magnetoresistive effect element. When the strength and direction of the magnetic field applied to the magnetoresistive effect element changes from the design, noise or offset is caused to occur in the output from the magnetic sensor, and there is a fear that the sensitivity of the magnetic sensor could fluctuate. In order to control the occurrence of this kind of noise or offset in the output and fluctuation in sensitivity, in general, a driver IC for impressing a bias electric current on the magnetoresistive effect element is provided in the magnetic sensor. Through control by this driver IC, a bias electric current adjusted within a prescribed range can be applied to the magnetoresistive effect element, but because the range within which the bias electric current can be adjusted is limited, there are times when it may be difficult to control the above-described occurrence of noise or offset or fluctuations in sensitivity solely by adjusting the bias electric current. In addition, there may be cases in which the above-described gap fluctuates while a user is using an application in which the above-described magnetic sensor is incorporated. It is virtually impossible to correct changes in the properties of the magnetic sensor caused by this kind of fluctuation in the gap through a bias electric current under control of the driver IC.

In consideration of the foregoing, it is an object of the present invention to provide a magnetic sensor device with improved detection accuracy.

Means for Solving the Problem

To resolve the above-described problems, the present invention provides a magnetic sensor device including a magnetic field converter that receives an input magnetic field input along a first direction, and outputs an output magnetic field along a second direction, which is orthogonal to the first direction; a magnetic field detector provided at a position where the output magnetic field can be applied; and a magnetic shield that shields external magnetic fields along a third direction, which is orthogonal to both the first direction and the second direction. When viewed along the first direction, the magnetic field converter has a shape such that the length in the third direction is greater than the length in the second direction. When viewed along the first direction, the magnetic shield is provided at a position overlapping the magnetic field converter and the magnetic field detector, and the magnetic field transmittance of the external magnetic field is 1~30%.

In the above-described magnetic sensor device, wherein when viewed along the first direction, the magnetic shield should have a shape such that the maximum length in the third direction is less than the maximum length in the second direction, the linearity of a sensor signal output from the magnetic sensor device in accordance with the magnetic field strength of the output magnetic field should be 1% or less, and the length of a gap between the magnetic field detector and the magnetic shield in the first direction should be 0~10 μm.

In the above-described magnetic sensor device, a plurality of the magnetic shields may be arranged in parallel along the third direction, and the magnetic shield should include a first magnetic shield and a second magnetic shield, the magnetic field converter and the magnetic field detector should be provided in a gap between the first magnetic shield and the second magnetic shield in the first direction, and the length of the gap between the first magnetic shield and the second magnetic shield in the first direction should be 1~40 μm.

In the above-described magnetic sensor device, when viewed along the first direction, the magnetic shield may be positioned to the front side or the back side of the magnetic field converter and the magnetic field detector, and the device may further include a plurality of magnetic field detectors, wherein when viewed along the first direction, the plurality of magnetic field detectors is provided at a position that is on an axis passing through the center of the magnetic field converter in the short-wise direction and that is line-symmetrical about the axis along the lengthwise direction of the magnetic field converter.

In the above-described magnetic sensor device, the magnetic field detector may include a magnetoresistive effect element, and the magnetoresistive effect element may include a magnetization fixed layer, in which the magnetization is fixed, and a magnetization free layer, the magnetization direction of which changes in accordance with the output magnetic field that is applied, and the magnetic field detector may include a TMR element or a GMR element.

Efficacy of the Invention

With the present invention, it is possible to provide a magnetic sensor device with improved detection accuracy.

BEST MODE FOR IMPLEMENTING THE INVENTION

The best mode for implementing the invention will be described with reference to the drawings.

In a magnetic sensor device according to this embodiment, in some of the drawings the "X direction, Y direction and Z direction" are stipulated as necessary. Here, the X direction and the Y direction are mutually orthogonal directions within a plane substantially parallel to a first surface 104A and a second surface 104B (see FIG. 2) of a substrate 104 in this embodiment, and the Z direction is the direction of depth of the substrate 104 (the direction orthogonal to the first surface 104A and the second surface 104B of the substrate 104).

Figure 1:
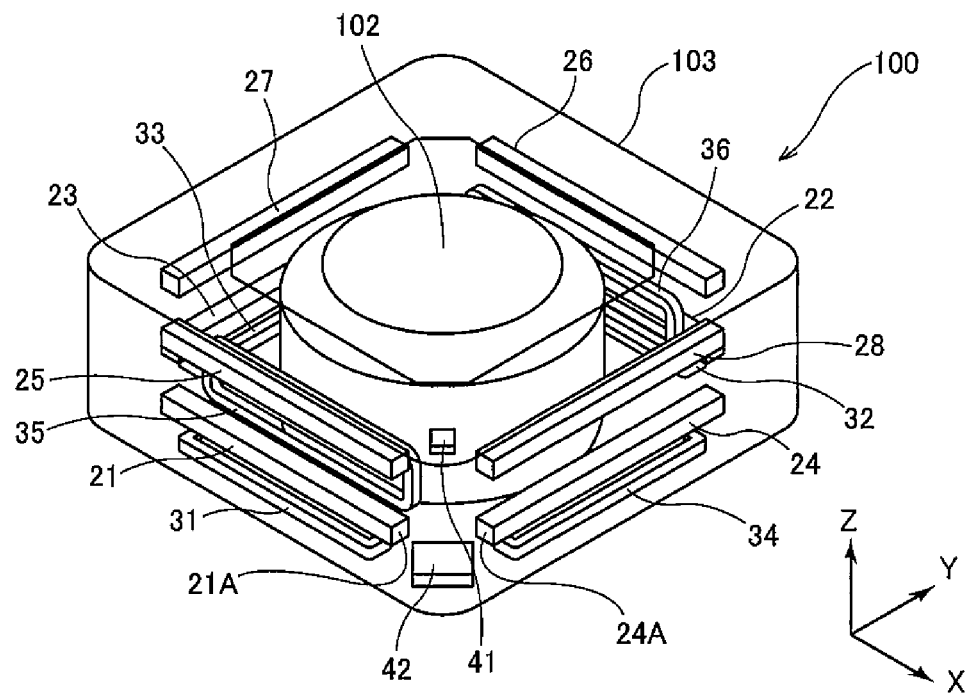
FIG. 1 is a perspective view showing a schematic configuration of a camera module that includes a magnetic sensor device according to one embodiment of the present invention.
Figure 2:
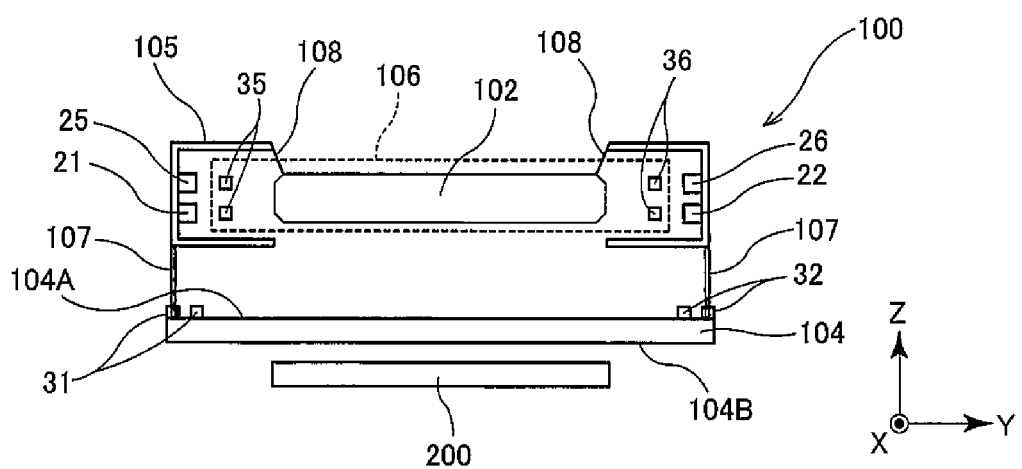
FIG. 2 is a schematic diagram schematically showing the internal structure of the camera module shown in FIG. 1.

The camera module 100 according to this embodiment is, for example, a part of a smart phone camera that includes an optical image stabilization mechanism and an auto-focus mechanism, and is used in combination with an image sensor 200 using CMOS or the like (see FIG. 1 and FIG. 2).

The camera module 100 includes a drive device, a lens 102, a housing 103 and the substrate 104 (see FIG. 1 and FIG. 2). The drive device has the function of causing the lens 102 to move. The drive device includes a magnetic sensor device according to this embodiment. The housing 103 has the function of protecting the drive device. The substrate 104 includes the first surface 104A and the second surface 104B, which is opposite to the first surface 104A.

The lens 102 is positioned above the first surface 104A of the substrate 104 in an attitude such that the optical axis direction thereof is parallel to the Z direction. The substrate 104 has an aperture (not shown the drawings) that lets in light that has passed through the lens 102. The camera module 100 is aligned with the image sensor 200 such that light that has passed through the lens 102 and the aperture of the substrate 104 is caused to be incident on the image sensor 200.

The drive device includes a first holding member 105, a second holding member 106, a plurality of first wires 107 and a plurality of second wires 108 (see FIG. 2). The second holding member 106 holds the lens 102, and for example may have a cylindrical shape in which the lens 102 can be mounted.

The second holding member 106 is provided such that the position thereof is changeable in one direction with respect to the first holding member 105, specifically in the direction parallel to the optical axis direction (the Z direction) of the lens 102. In this embodiment, the first holding member 105 has a box-like shape capable of housing on the inside thereof the lens 102 and the second holding member 106. The plurality of second wires 108 connects the first holding member 105 and the second holding member 106 and holds the second holding member 106 such that the second holding member 106 is moveable relative to the first holding member 105 along the Z direction.

The first holding member 105 is provided above the first surface 104A of the substrate 104 such that the position thereof is changeable with respect to the substrate 104 in at least one of the X direction and the Y direction. The plurality of first wires 107 connects the substrate 104 and the first holding member 105, and holds the first holding member 105 such that the first holding member 105 is moveable relative to the substrate 104 along at least one of the X direction and the Y direction. When the position of the first holding member 105 relative to the substrate 104 changes, the position of the second holding member 106 relative to the substrate 104 also changes.

Figure 3:
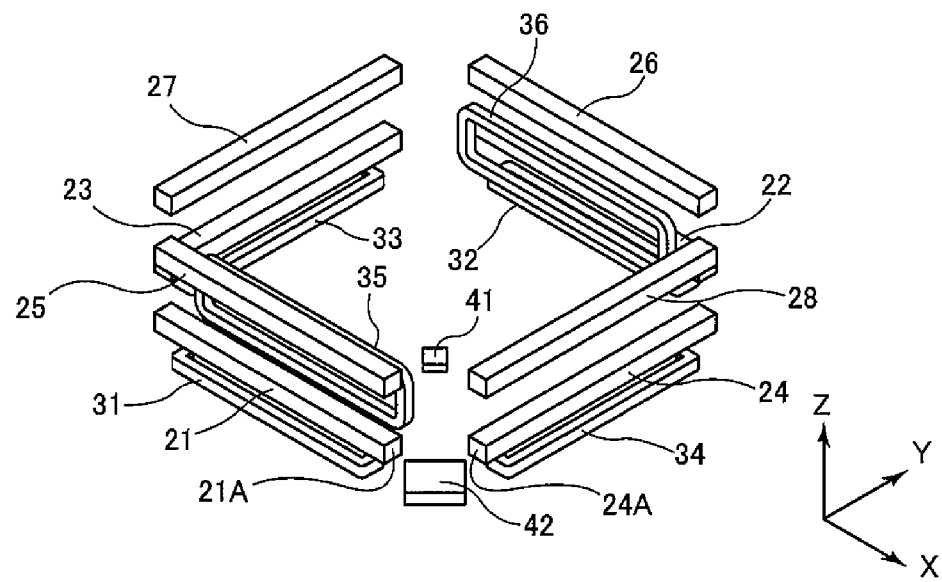
FIG. 3 is a perspective view showing the drive device of the camera module shown in FIG. 1.

The drive device includes a plurality of magnets (first through eighth magnets 21~28) and a plurality of coils (first through sixth coils 31~36) (see FIG. 1 and FIG. 3). The first magnet 21 and the second magnet 22 are positioned so that the lens 102 is between the first magnet 21 and the second magnet 22 along the Y direction. The third magnet 23 and the fourth magnet 24 are positioned so that the lens 102 is between third magnet 23 and the fourth magnet 24 along the X direction. The fifth through eighth magnets 25~28 are positioned above (in the +Z direction from) the first through fourth magnets 21~24, respectively. The first through eighth magnets 21~28 are fixed to the first holding member 105.

Figure 6:
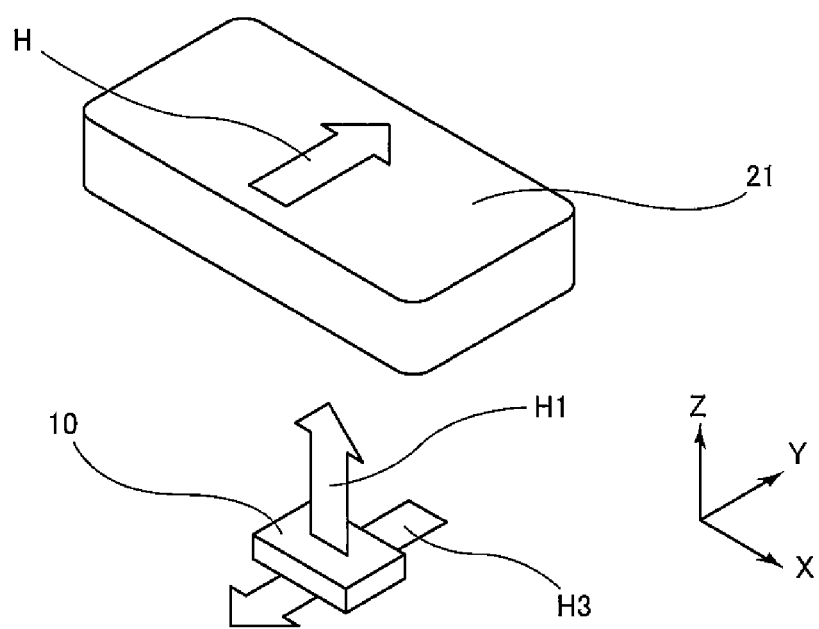
FIG. 6 is a perspective view showing the main parts of the magnetic sensor device according to one embodiment of the present invention.

The first magnet 21, the second magnet 22, the fifth magnet 25 and the sixth magnet 26 each have a rectangular parallelepiped shape with the lengthwise direction thereof in the X direction. The third magnet 23, the fourth magnet 24, the seventh magnet 27 and the eighth magnet 28 each have a rectangular parallelepiped shape with the lengthwise direction thereof in the Y direction (see FIG. 1 and FIG. 3). The magnetization direction H of the first magnet 21 (see FIG. 6) and the magnetization direction of the sixth magnet 26 are the +Y direction, and the magnetization directions of the second magnet 22 and the fifth magnet 25 are the −Y direction. The magnetization directions of the third magnet 23 and the eighth magnet 28 are the +X direction, and the magnetization directions of the fourth magnet 24 and the seventh magnet 27 are the −X direction.

The first coil 31 is positioned between the first magnet 21 and the substrate 104, and the second coil 32 is positioned between the second magnet 22 and the substrate 104 (see FIG. 2). The third coil 33 is positioned between the third magnet 23 and the substrate 104, and the fourth coil 34 is positioned between the fourth magnet 24 and the substrate 104. The fifth coil 35 is positioned between the lens 102 and the first magnet 21 and fifth magnet 25, and the sixth coil 36 is positioned between the lens 102 and the second magnet 22 and sixth magnet 26. The first through fourth coils 31~34 are fixed to the first surface 104A of the substrate 104, and the fifth coil 35 and the sixth coil 36 are fixed to the second holding member 106.

A magnetic field generated primarily from the first magnet 21 is applied to the first coil 31, a magnetic field generated primarily from the second magnet 22 is applied to the second coil 32, a magnetic field generated primarily from the third magnet 23 is applied to the third coil 33 and a magnetic field generated primarily from the fourth magnet 24 is applied to the fourth coil 34.

Figure 4:
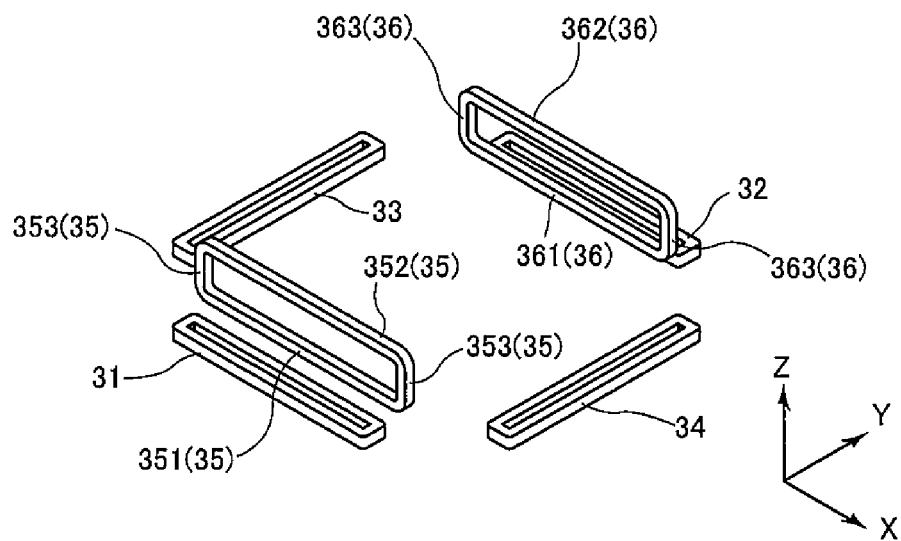
FIG. 4 is a perspective view showing a plurality of coils of the drive device shown in FIG. 3.

The fifth coil 35 includes a first conductor 351 extending in the X direction along the first magnet 21, a second conductor 352 extending in the X direction along the fifth magnet 25, and two third conductors 353 connecting in the Z direction one end of each of the first conductor 351 and the second conductor 352 and the other ends of each of the first conductor 351 and the second conductor 352 (see FIG. 4). The sixth coil 36 includes a first conductor 361 extending in the X direction along the second magnet 22, a second conductor 362 extending in the X direction along the sixth magnet 26, and two third conductors 363 connecting in the Z direction one end of each of the first conductor 361 and the second conductor 362 and the other ends of each of the first conductor 361 and the second conductor 362 (see FIG. 4).

The component in the +Y direction of the magnetic field generated primarily from the first magnet 21 is applied to the first conductor 351 of the fifth coil 35. The component in the −Y direction of the magnetic field generated primarily from the fifth magnet 25 is applied to the second conductor 352 of the fifth coil 35. The component in the −Y direction of the magnetic field generated primarily from the second magnet 22 is applied to the first conductor 361 of the sixth coil 36. The component in the +Y direction of the magnetic field generated primarily from the sixth magnet 26 is applied to the second conductor 362 of the sixth coil 36.

Figure 5A:
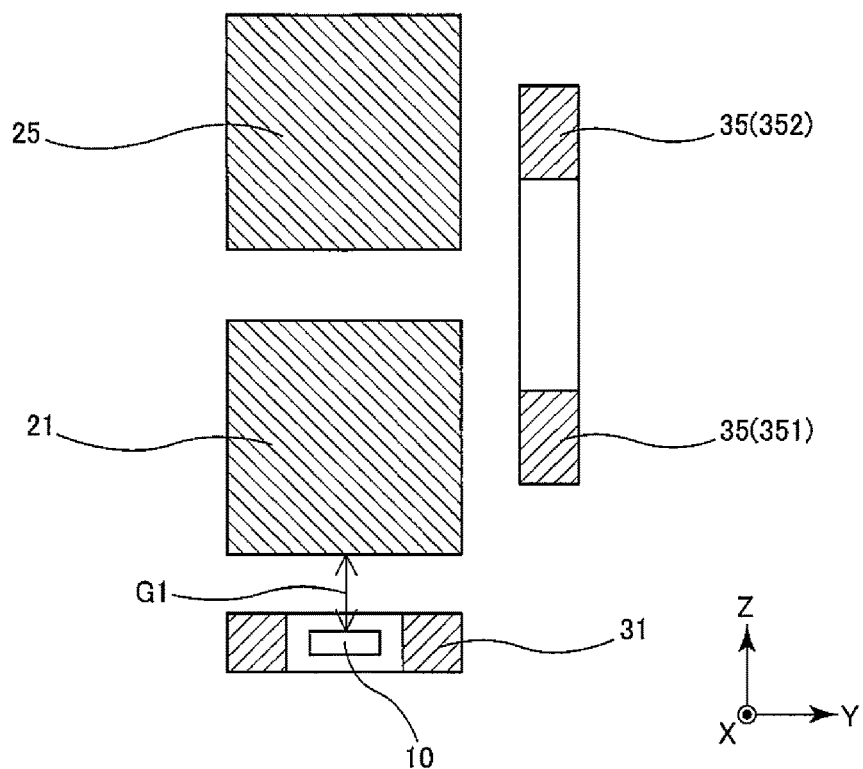
FIG. 5A is a cross-sectional view showing the main parts of the drive device shown in FIG. 3.
Figure 5B:
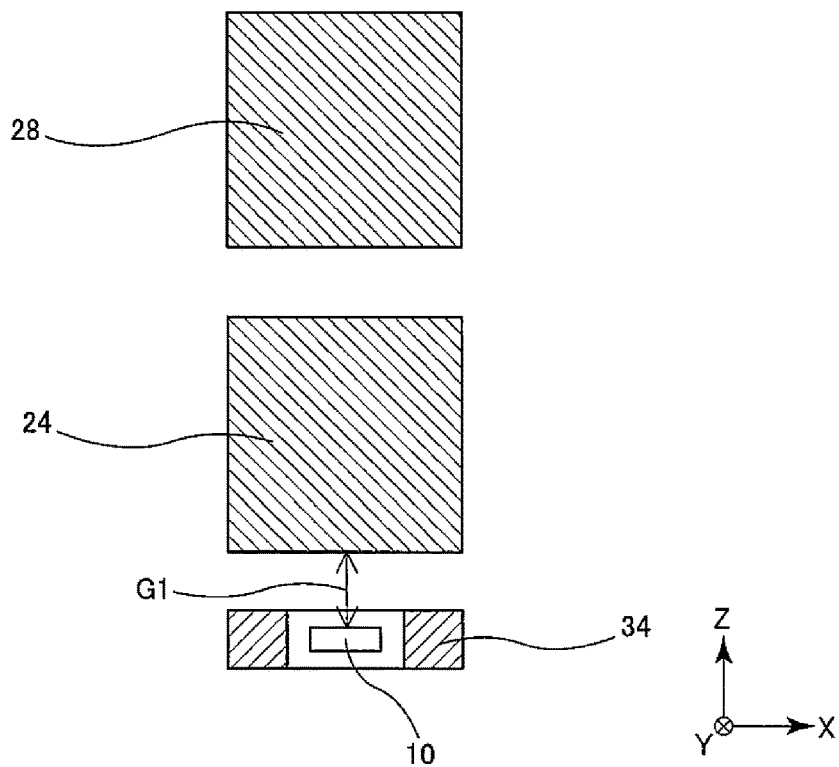
FIG. 5B is a cross-sectional view showing the main parts of the drive device shown in FIG. 3.

The drive device includes a magnetic sensor 10 fixed to the substrate 104 inside either the first coil 31 or the second coil 32, and a magnetic sensor 10 fixed to the substrate 104 inside either the third coil 33 or the fourth coil 34. In this embodiment, the two magnetic sensors 10 are positioned inside the first coil 31 and inside the fourth coil 34, respectively (see FIG. 5A, FIG. 5B). The two magnetic sensors 10 output sensor signals for changing the position of the lens 102 to reduce the effect of camera shaking.

The magnetic sensor 10 positioned inside the first coil 31 detects the magnetic field generated from the first magnet 21 and outputs a sensor signal corresponding to the position of the first magnet 21. The magnetic sensor 10 positioned inside the fourth coil 34 detects the magnetic field generated from the fourth magnet 24 and outputs a sensor signal corresponding to the position of the fourth magnet 24. The configuration of each of the magnetic sensors 10 is described below.

The drive device includes a magnet 41 and a magnetic sensor 42 (see FIG. 1 and FIG. 3). The magnetic sensor 42 is used for detecting the position of the lens 102 when performing automatic focusing. The magnetic sensor 42 is fixed to the first surface 104A of the substrate 104 near an end face 21A of the first magnet 21 and an end face 24A of the fourth magnet 24. The magnetic sensor 42 may include, for example, a Hall element and/or a magnetoresistive effect element such as an AMR element, a GMR element, and a TMR element.

The magnet 41 has a rectangular parallelepiped shape and is fixed to the second holding member 106 above the magnetic sensor 42. When the relative position of the second holding member 106 with respect to the first holding member 105 changes in a direction parallel to the Z direction, the relative position of the magnet 41 with respect to the first holding member 105 also changes in a direction parallel to the Z direction.

The action of the drive device will now be described.

The drive device makes up a portion of the optical image stabilization mechanism and the autofocus mechanism. The drive device, the optical image stabilization mechanism and the autofocus mechanism are controlled by an external control unit (not shown in the drawings) of the camera module 100.

The optical image stabilization mechanism is configured to be capable of detecting camera shaking through a gyro sensor or the like external to the camera module 100, for example. When shaking is detected by the optical image stabilization mechanism, the drive device is controlled so that the relative position of the lens 102 with respect to the substrate 104 changes in accordance with the mode of the shaking. This makes it possible to stabilize the absolute position of the lens 102 and to reduce the effects of camera shaking. The relative position of the lens 102 with respect to the substrate 104 changes in the X direction and the Y direction according to the mode of the camera shaking.

The autofocus mechanism is configured to be capable of detecting the state in which the subject is in focus by using, for example, the image sensor 200 or an autofocus sensor or the like. The control unit causes the relative position of the lens 102 with respect to the substrate 104 to change in the Z direction through the drive mechanism to achieve a state of focus on the subject. This makes it possible to automatically focus on the subject.

The actions of the drive device relating to the optical image stabilization mechanism will now be described.

When an electric current is applied to the first coil 31 and the second coil 32 by the control unit, the first holding member 105 to which the first magnet 21 and the second magnet 22 are fixed moves in the Y direction through the mutual effect of the magnetic fields generated from the first magnet 21 and the second magnet 22 and the magnetic fields generated from the first coil 31 and the second coil 32. As a result, the lens 102 also moves in the Y direction. In addition, when an electric current is applied to the third coil 33 and the fourth coil 34 by the control unit, the first holding member 105 to which the third magnet 23 and the fourth magnet 24 are fixed moves in the X direction through the mutual effect of the magnetic fields generated from the third magnet 23 and the fourth magnet 24 and the magnetic fields generated from the third coil 33 and the fourth coil 34. As a result, the lens 102 also moves in the X direction. The control unit detects the position of the lens 102 based on signals corresponding to the positions of the first magnet 21 and the second magnet 24 detected by the two magnetic sensors 10.

The actions of the drive device relating to the autofocus mechanism will now be described. When the relative position of the lens 102 with respect to the substrate 104 is moved in the Z direction, the control unit applies an electric current on the fifth coil 35 so that an electric current flows in the +X direction in the first conductor 351 and an electric current flows in the −X direction in the second conductor 352 and applies an electric current on the sixth coil 36 so that an electric current flows in the −X direction in the first conductor 361 and an electric current flows in the +X direction in the second conductor 362. Due to these electric currents and the magnetic fields generated from the first magnet 21, the second magnet 22, the fifth magnet 25 and the sixth magnet 26, a Lorentz force in the Z direction acts on the first conductor 351 and the second conductor 352 of the fifth coil 35 and the first conductor 361 and the second conductor 362 of the sixth coil 36. Consequently, the second holding member 106, to which the fifth coil 35 and the sixth coil 36 are fixed, moves in the Z direction. As a result, the lens 102 also moves in the Z direction. When the relative position of the lens 102 is moved with respect to the substrate 104 in the −Z direction, the control unit causes electric currents to be applied to the fifth coil 35 and the sixth coil 36 in the opposite directions with respect to the above-described case of the lens 102 being caused to move in the Z direction.

When the relative position of the lens 102 with respect to the substrate 104 changes in the Z direction, the relative position of the magnet 41 with respect to the magnetic sensor 42 also changes in the Z direction. The magnetic sensor 42 detects at least the magnetic field generated by the magnet 41 and creates a signal corresponding to the position of the magnet 41. The control unit detects the position of the lens 102 based on the signal created by the magnetic sensor 42.

The schematic configuration of the magnetic sensor device according to this embodiment will be described next.

The magnetic sensor device according to this embodiment includes the magnetic sensor 10, which is positioned inside the first coil 31, and the first magnet 21 as a magnetic field generator. In addition, the magnetic sensor device according to this embodiment includes the magnetic sensor 10, which is positioned inside the second coil 32, and the second magnet 22 as a magnetic field generator. Below, the description will take as an example the magnetic sensor device that includes the magnetic sensor 10 positioned inside the first coil 31 and the first magnet 21, but it goes without saying that the below description also applies to the magnetic sensor device that includes the magnetic sensor 10 positioned inside the second coil 32 and the second magnet 22.

In the magnetic sensor device, the magnetic sensor 10 and the first magnet 21 are configured such that a partial magnetic field that is a portion of the magnetic field generated from the first magnet 21 can be applied to the magnetic sensor 10. The partial magnetic field generated from the first magnet 21 includes, for example, a first magnetic field component H1 parallel to the Z direction as a first direction, and a third magnetic field component H3 parallel to the Y direction as a third direction. In this embodiment, the magnetization direction H of the first magnet 21 is parallel to the Y direction and the direction of the third magnetic field component H3 that can be applied to the magnetic sensor 10 is parallel to the −Y direction (see FIG. 6). In this embodiment, the magnetic field strength of the third magnetic field component H3 should be 100 mT (millitesla) or greater. When this magnetic field strength is less than 100 mT, even if the below-described magnetic field transmittance of the third magnetic field component H3 is small (for example, less than 1%), fluctuation in the output from the magnetic sensor 10 caused by variance in the length G1 (see FIGS. 5A, 5B) of the gap between the magnetic sensor 10 and the first magnet 21 becomes relatively small; however, when this magnetic field strength is 100 mT or greater, fluctuation in the output from the magnetic sensor 10 caused by variance in the length G1 of the gap between the magnetic sensor 10 and the first magnet 21 becomes relatively large.

As described above, the magnetic sensor 10 is fixed to the substrate 104 and the first magnet 21 is fixed to the first holding member 105. When the position of the first holding member 105 relative to the substrate 104 changes in the Y direction, the relative position of the first magnet 21 with respect to the magnetic sensor 10 also changes in the Y direction. The output from the magnetic sensor 10 corresponds to the relative position of the first magnet 21 with respect to the magnetic sensor 10, in the Y direction.

Figure 7:
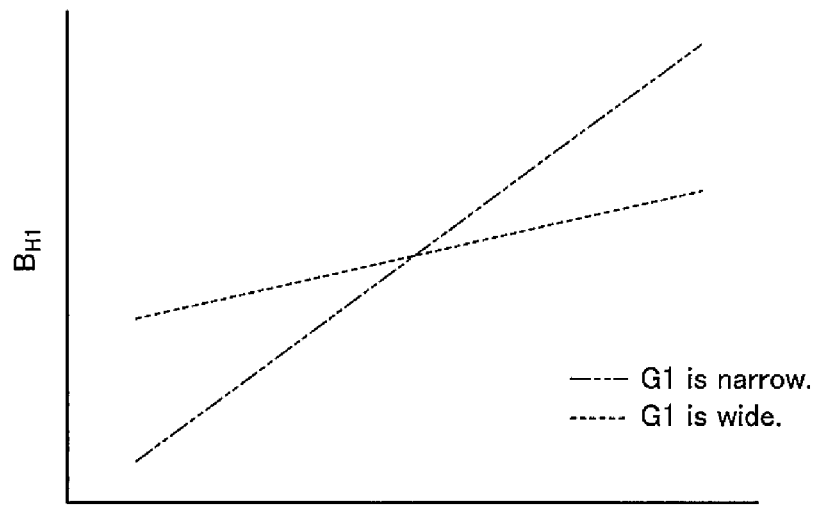
FIG. 7 is a graph for describing the change in the magnetic field strength of the first magnetic field component due to fluctuation in the relative positions of the magnetic sensor and the magnet caused by differences in the length of the gap to the magnetic sensor and the magnet.

The magnetic sensor 10 and the first magnet 21 are configured so that when their relative position changes in the Y direction, the first magnetic field component H1 changes. In this embodiment, when the first holding member 105 moves in the Y direction and the relative position of the magnetic sensor 10 and the first magnet 21 changes, the first magnetic field component H1 changes. As described below, in this embodiment, the first magnetic field component H1 is converted into the second magnetic field component H2, which is parallel to the X direction as a second direction, and a signal corresponding to this second magnetic field component H2 is output. If the first magnet 21 and the magnetic sensor 10 are assembled so that the length G1 of the gap therebetween (the length in the Z direction) is as designed, the desired signal from the magnetic sensor 10 is output in accordance with the change in the relative positions of the magnetic sensor 10 and the first magnet 21. However, when this length G1 is small, the change rate of the magnetic field strength $B_{H1}$ of the first magnetic field component H1, in accordance with change in the relative positions of the magnetic sensor 10 and the first magnet 21, becomes large (see FIG. 7). In addition, when this length G1 is large, the change rate of the magnetic field strength $B_{H1}$ of the first magnetic field component H1, in accordance with change in the relative positions of the magnetic sensor 10 and the first magnet 21, becomes small (see FIG. 7).

Figure 8:
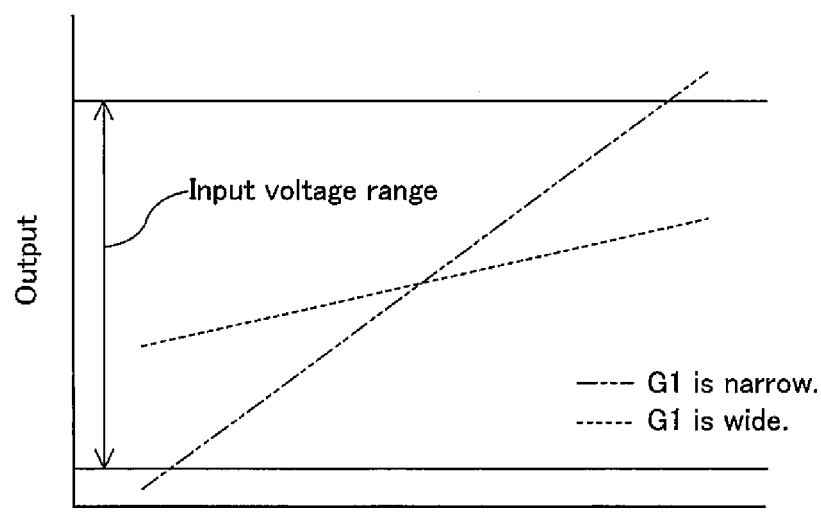
FIG. 8 is graph for describing the relationship between the input voltage range of the impedance alignment device and the change in the output voltage of the magnetic sensor caused by differences in the length of the gap to the magnetic sensor and the magnet.
Figure 9:
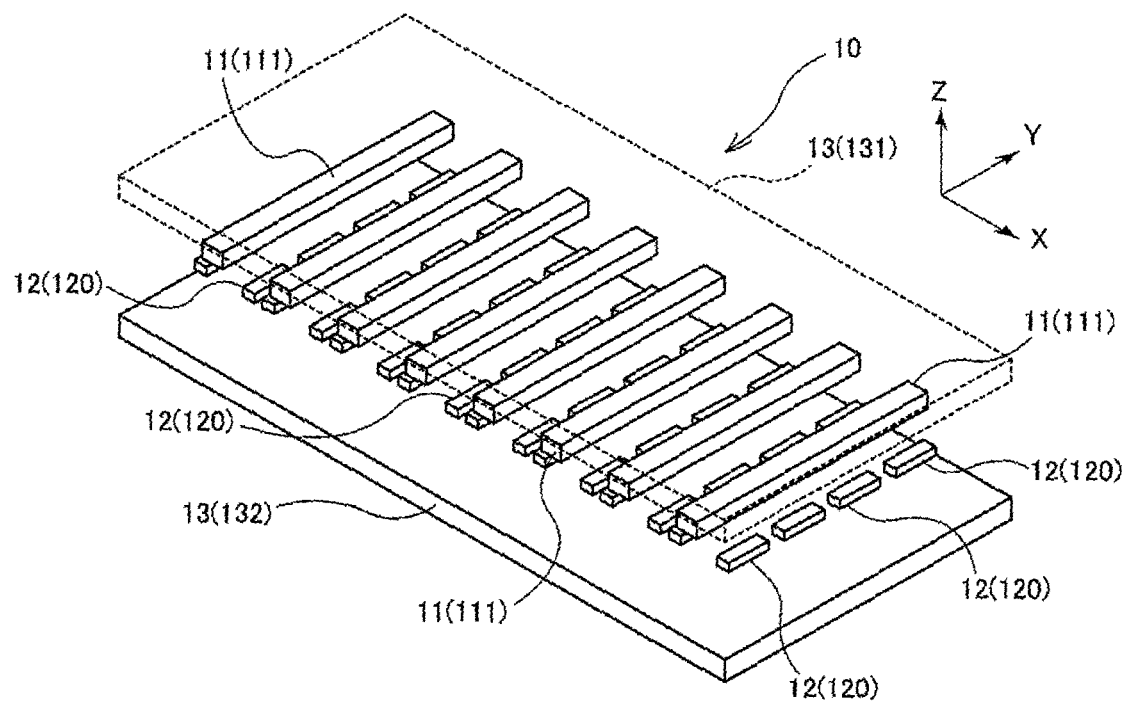
FIG. 9 is a perspective view showing a schematic configuration of a magnetic sensor according to one embodiment of the present invention.

In addition, the magnetic sensor 10 is provided with an impedance alignment device such as an op amp or the like as an analog front end (AFE) for amplifying the signal (analog signal) output from the below-described magnetic field detector 12 (see FIG. 9). The signal output from this impedance alignment device is input into a signal processing circuit for calculating the relative positions of the first magnet 21 and the magnetic sensor 10 and subjected to signal processing, but when the output voltage from the magnetic field detector 12 exceeds the input voltage range of the impedance alignment device, there is concern that the impedance alignment device will output an erroneous signal to the signal processing circuit. If the above-described length G1 between the magnetic sensor 10 and the first magnet 21 is as designed, the output voltage from the magnetic field detector 12 does not exceed the input voltage range of the impedance alignment device, but when the above-described length G1 is small, there is a concern that the output voltage from the magnetic field detector 12 will exceed this input voltage range, and when the above-described length G1 is large, there is a concern that the output voltage from the magnetic field detector 12 will become too small (see FIG. 8).

The magnetic sensor device according to this embodiment includes a driver IC that impresses a bias electric current of a prescribed current value on the magnetic field detector 12 so that the magnetic field strength of the first magnetic field component H1 changes with a suitable change rate in accordance with change in the relative positions of the magnetic sensor 10 and the first magnet 21, while the output voltage from the magnetic field detector 12 does not exceed the input voltage range of the impedance alignment device. However, when the above-described length G1 between the magnetic sensor 10 and the first magnet 21 in this embodiment changes from the design value due to variance at the time of assembly or the like, there is a concern that the magnetic field strength of the first magnetic field component H1 applied to the magnetic sensor 10 will have difficulty changing at a suitable change rate in accordance with change in the relative positions of the magnetic sensor 10 and the first magnet 21 and that the output voltage from the magnetic field detector 12 will change. That is, variance or the like in the sensitivity or the magnetic sensor 10 may arise. However, in the magnetic sensor 10 according to this embodiment, as described below, it is possible to control variance or the like in sensitivity caused by variance or the like at the time of assembly of the above-described length G1 between the magnetic sensor 10 and the first magnet 21.

The magnetic sensor 10 according to this embodiment includes a magnetic field converter 11 into which the magnetic field component in the Z direction (the first magnetic field component H1) generated from the first magnet 21 is input. The magnetic field converter 11 converts this first magnetic field component H1 into the magnetic field component in the X direction (second magnetic field component H2) and outputs such. A magnetic field detector 12 is provided at a position at which the second magnetic field component H2 can be applied as the output magnetic field output from this magnetic field converter 11. A magnetic shield 13 is provided for shielding the magnetic field component in the Y direction (the third magnetic field component H3) generated from the first magnet 21 from being applied to the magnetic field detector 12 as an external magnetic field (see FIG. 9 through FIG. 12).

The magnetic field converter 11 includes a plurality of yokes 111 made of a soft magnetic material. In this embodiment, an aspect in which the magnetic field converter 11 includes a plurality of yokes 111 is taken as an example, but this is intended to be illustrative and not limiting, for the magnetic field converter 11 may also include just one yoke 111. Each of the plurality of yokes 111 has a shape such that the length in the Y direction is longer than the length in the X direction, and for example has a rectangular shape when viewed along the Z direction. Each of the plurality of yokes 111 may also be provided so that the lengthwise direction of each yoke 111 is parallel to the Y direction or may be provided to be arranged in parallel along the X direction, when viewed along the Z direction. In this embodiment, the shape, the length in the lengthwise direction and the length in the short-wise direction of the plurality of yokes 111 are the same, but it is fine if at least one of these differs. In addition, each of the yokes 111 is continuous in the Y direction but may also be divided into multiple pieces (for example, two pieces) in the Y direction. The rectangular shape as the shape of each of the yokes 111 when viewed along the Z direction is one example, and this is intended to be illustrative and not limiting. For example, the shape of each of the yokes 111 when viewed along the Z direction may be a quadrilateral in which the four corners are 89·91°, or may be a rectangle with four rounded corners.

Figure 13:
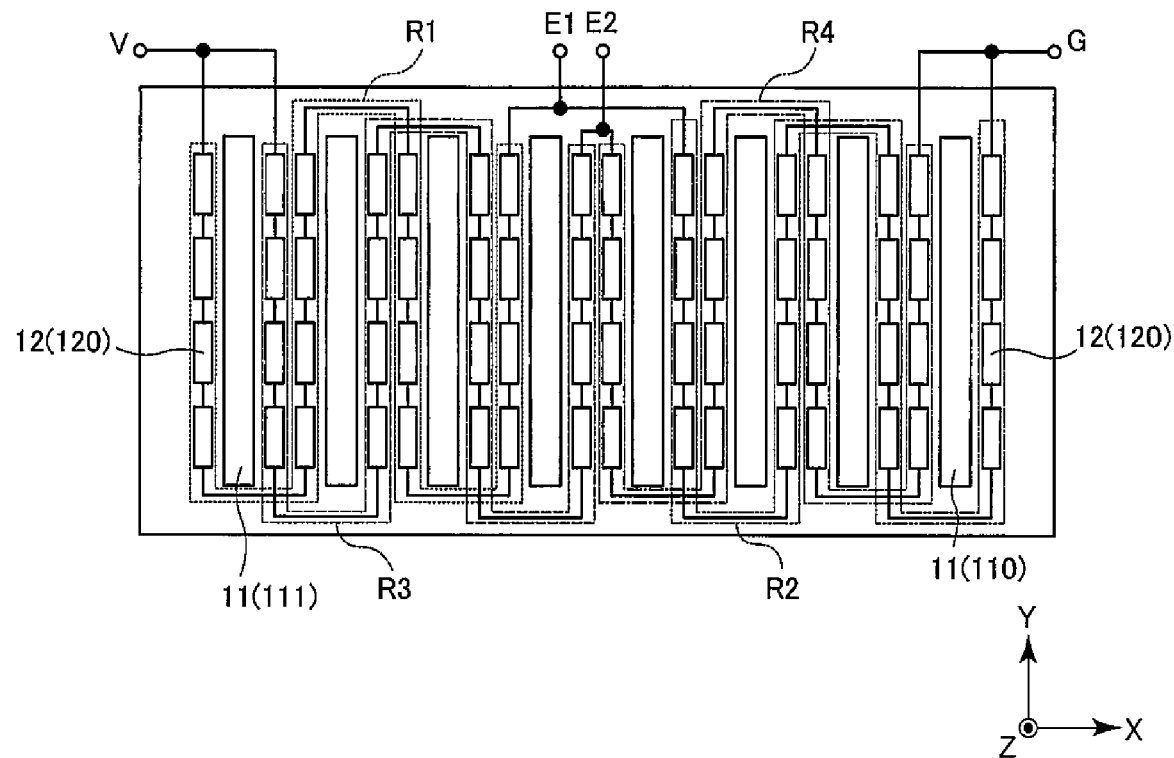
FIG. 13 is a plan view showing a schematic configuration of a magnetic sensor according to one embodiment of the present invention.
Figure 19:
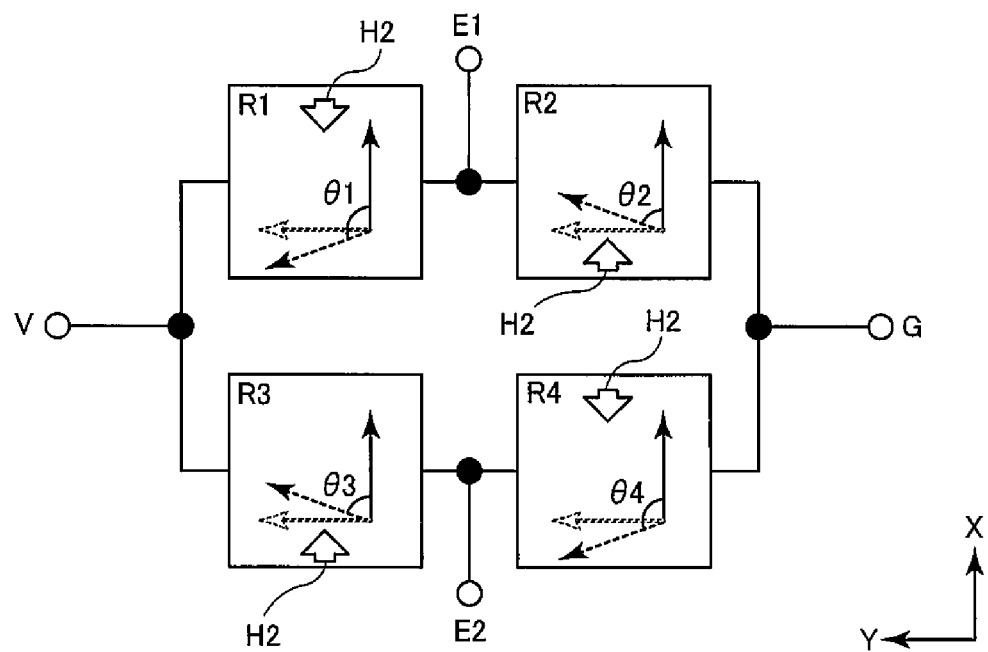
FIG. 19 is an explanatory diagram for explaining the magnetization directions of the free layer and the magnetization fixed layer when a third magnetic field component is applied to the magnetoresistive effect element according to one embodiment of the present invention.

The magnetic field detector 12 outputs a signal corresponding to the change in the first magnetic field component H1 when the second magnetic field component H2 is applied (see FIG. 19). The magnetic field detector 12 may include at least one magnetoresistive effect element 120. As shown in FIG. 13, in this embodiment, the magnetic field detector 12 includes a first resistor unit R1, a second resistor unit R2, a third resistor unit R3 and a fourth resistor unit R4. Each of the first through fourth resistor units R1~R4 can include at least one magnetoresistive effect element 120, and each of the first through fourth resistor units R1~R4 includes an element row in which a plurality of magnetoresistive effect elements is connected in series. In the example shown in FIG. 13, the element rows included in each of the first through fourth resistor units R1~R4 have 16 magnetoresistive effect elements 120 connected in series. The first through fourth resistor units R1~R4 may each include element rows in which a plurality of magnetoresistive effect elements are connected in parallel.

Figure 15:
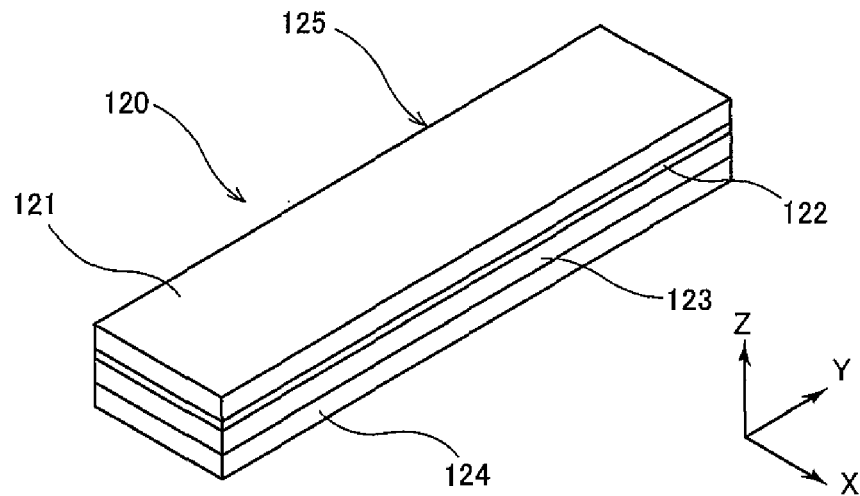
FIG. 15 is a perspective view showing a schematic configuration of a magnetoresistive effect element according to one embodiment of the present invention.

As the magnetoresistive effect elements 120 in this embodiment, it is possible to use MR elements such as TMR elements, GMR elements or the like, for example. The magnetoresistive effect elements 120 have an MR laminated body 125 that includes an antiferromagnetic layer 124, a magnetization fixed layer 123, a nonmagnetic layer 122 and a free layer 121, layered in that order (see FIG. 15). The antiferromagnetic layer 124 is made of an antiferromagnetic material, and by being exchange-coupled with the magnetization fixed layer 123, serves the role of fixing the direction of magnetization of the magnetization fixed layer 123. In addition, the antiferromagnetic layer 124 may be omitted by making the magnetization fixed layer 123 a so-called self-pinned fixed layer (synthetic ferri pinned layer, or SFP layer) with a laminated ferri structure of a ferromagnetic layer/nonmagnetic intermediate layer/ferromagnetic layer and in which the two ferromagnetic layers are antiferromagnetically coupled.

In a TMR element, the nonmagnetic layer 122 is a tunnel barrier layer. In a GMR element, the nonmagnetic layer 122 is a nonmagnetic conductive layer. In a TMR element or GMR element, the resistance value changes in accordance with the angle formed by the direction of magnetization of the free layer 121 and the direction of magnetization of the magnetization fixed layer 123, and the resistance value becomes a minimum when this angle is 0° (when the two magnetization directions are parallel), and the resistance value becomes a maximum when this angle is 180° (when these magnetization directions are anti-parallel).

Figure 16:
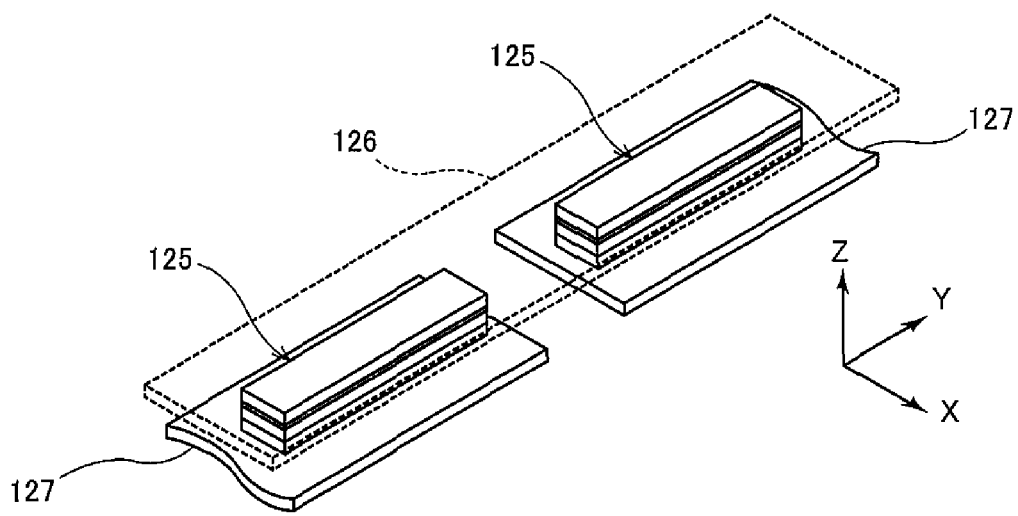
FIG. 16 is a perspective view showing the schematic configuration of the magnetic field detector according to one embodiment of the present invention.

The magnetoresistive effect element 120 may be such that when viewed along the Z direction, the plurality of roughly rectangular MR laminated bodies 125 is connected in series via an upper lead electrode 126 and a lower lead electrode 127 (see FIG. 16). In the MR laminated body 125 shown in FIG. 16, an electric current flows in the direction of lamination thereof (the +Z direction, –Z direction) but the magnetoresistive effect element 120 in this embodiment may also be an element of the Current in Plane (CIP) type in which an electric current flows in the in-plane direction (for example, the +X direction, –X direction) of the MR laminated body 125. The upper lead electrode 126 and the lower lead electrode 127 are made of one type of conductive material, or a compound film of two or more types of conductive material, out of Cu, Al, Au, Ta, Ti or the like, for example. A roughly rectangular shape means, other than a rectangular shape the length of which in the Y direction is longer than the length in the X direction when viewed along the Z direction, a quadrilateral shape in which the length in the Y direction is longer than the length in the X direction and the four corners are 89~91°, and a rounded rectangular shape in which the length in the Y direction is longer than the length in the X direction and the four corners are rounded, and the like. In this embodiment, the shape of the MR laminated body 125 when viewed along the Z direction is not limited to a roughly rectangular shape but may be an elliptical shape, an oval shape or the like.

Each of the plurality of lower lead electrodes 127, for example, has a roughly rectangular shape and is positioned so that there is a prescribed gap between two adjacent lower lead electrodes 127 in the electrical series direction of the plurality of MR laminated bodies 125 and is positioned o connect in series the plurality of MR laminated bodies 125, and two adjacent MR laminated bodies 125 are electrically connected to each other. The MR laminated bodies 125 are provided near each end of the lower lead electrodes 127 in the lengthwise direction. That is, two MR laminated bodies 125 are provided on each of the plurality of lower lead electrodes 127.

The plurality of upper lead electrodes 126 is provided on the plurality of MR laminated bodies 125. Each of the upper lead electrodes 126 for example has a long, slender, roughly rectangular shape. The upper lead electrodes 126 are positioned so that there is a prescribed gap between two adjacent upper lead electrodes 126 in the electrical series direction of the plurality of MR laminated bodies 125 and so that the plurality of MR laminated bodies 125 is connected in series, and two adjacent MR laminated bodies 125 are electrically connected to each other. A gap layer (protective layer) is provided between the free layer 121 and the lower lead electrodes 127 or the upper lead electrodes 126.

When viewed along the Z direction, the plurality of magnetoresistive effect elements 120 included in the first resistor unit R1 and the plurality of magnetoresistive effect elements 120 included in the fourth resistor unit R4 are positioned on the –X side of the magnetic field converter 11 (yoke 111) closest to each magnetoresistive effect element 120 in the X direction, and the plurality of magnetoresistive effect elements 120 included in the second resistor unit R2 and the plurality of magnetoresistive effect elements 120 included in the third resistor unit R3 are positioned on the +X side of the magnetic field converter 11 (yoke 111) closest to each magnetoresistive effect element 120 in the X direction (see FIG. 13). The plurality of magnetoresistive effect elements 120 is positioned to be line-symmetrical with respect to an axis (an axis extending in the lengthwise direction of the magnetic field converter 11 (yoke 111)) passing through the center of the magnetic field converter 11 (yoke 111) in the short direction (see FIG. 13). The configuration shown in FIG. 13 is intended to be illustrative and not limiting, for the length (length in the X direction) between the above-described axis of at least one of the magnetic field converters 11 (yoke 111) and the magnetoresistive effect element 120 positioned on the +X side of this magnetic field converter 11 (yoke 111) and the length (length in the X direction) between the above-described axis of that magnetic field converter 11 (yoke 111) and the magnetoresistive effect element 120 positioned on the −X side of this magnetic field converter 11 (yoke 111) may be substantially the same or may be mutually different. These two lengths being substantially the same means that the ratio of the two lengths is around 1:0.95~1:1.05. In addition, the plurality of magnetoresistive effect elements 120 need not be positioned at a position of linear symmetry centered on the above-described axis of at least one of the magnetic field converters 11 (yoke 111).

When viewed along the Z direction, the magnetic shield 13 includes a first magnetic shield 131 and a second magnetic shield 132 (see FIG. 9~FIG. 12) positioned so that the magnetic field converter 11 and the magnetic field detector 12 are between the first magnetic shield 131 and the second magnetic shield 132. That is, the magnetic shield 13 overlaps the magnetic field converter 11 and the magnetic field detector 12 when viewed along the Z direction. As long as the efficacy possessed by the magnetic sensor device according to this embodiment is achieved, the magnetic shield 13 may overlap a portion of the magnetic field converter 11 and the magnetic field detector 12 or may overlap the entirety of the magnetic field converter 11 and the magnetic field detector 12, when viewed along the Z direction. When viewed along the Z direction, the first magnetic shield 131 is positioned to the +Z direction (upward from) the magnetic field converter 11 and the magnetic field detector 12, and the second magnetic shield 132 is positioned in the −Z direction (downward from) the magnetic field converter 11 and the magnetic field detector 12. When viewed along the Z direction, the first magnetic shield 131 and the second magnetic shield 132 should both have a shape in which the maximum length in the Y direction is shorter than the maximum length in the X direction, and for example, should have a shape such as a rectangular shape, a quadrilateral shape in which the angles of the four corners are 89~91°, a rounded rectangular shape in which the four corners are rounded, a shape in which the four corners of a rectangle are beveled (an octagonal shape), an oval shape including an elliptical shape, a shape in which the two short sides facing the rectangle are in an arc shape, a trapezoid, a parallelogram, a rhombus or the like. When the magnetic shield 13 including the first magnetic shield 131 and the second magnetic shield 132 has, for example, a quadrilateral shape such as a quadrilateral shape in which the angles of the four corners are 89~91°, a trapezoid, a rhombus or the like, one set of two opposing sides out of the two sets of two opposing sides may be parallel, or the two sets of two opposing sides may each be non-parallel.

The magnetic shield 13 may be made of a soft magnetic material, for example. As a soft magnetic material, NiFe or the like can be cited, for example. When the magnetic shield 13 is made of NiFe, in order to reduce the thermal stress of the magnetic shield 13, the magnetic shield 13 is preferably made of NiFe having a composition in which the ratio of Ni is 35~60 wt %. With NiFe having this composition, it is possible to reduce the coefficient of thermal expansion. When the magnetic properties of the magnetic shield 13 are also taken into consideration, the magnetic shield 13 is preferably made of NiFe having a composition in which the Ni ratio is 40~60 wt %. One of the performance requirements for the magnetic shield 13 is that the maximum magnetic flux absorption is large. The maximum magnetic flux absorption of the magnetic shield 13 is substantially proportional to the product of the thickness (dimension in the Z direction) and the saturation magnetization of the magnetic shield 13. In order to ensure the performance of the magnetic shield 13, the product of the thickness and the saturation magnetization of the magnetic shield 13, that is, the magnetic moment per unit area, is preferably 0.6 emu/cm$^2$ or greater.

In this embodiment, when viewed along the Z direction, the magnetic shield 13 includes the first magnetic shield 131 positioned upward (the +Z side), which is one side, from the magnetic field converter 11 and the magnetic field detector 12, and the second magnetic shield 132 positioned downward (the −Z side), which is the other side, from the magnetic field converter 11 and the magnetic field detector 12, but as long as the function of the magnetic shield 13 is realized, either of the first magnetic shield 131 and the second magnetic shield 132 may be omitted. In addition, the first magnetic shield 131 may have a configuration in which a plurality of magnetic shields 131A~131D are arranged in parallel in the Y direction (see FIG. 11), the second magnetic shield 132 may have a configuration in which a plurality of magnetic shields 132A~132D are arranged in parallel in the Y direction (see FIG. 12), and both the first magnetic shield 131 and the second magnetic shield 132 may have configurations in which the plurality of magnetic shields 131A~131D and 132A~132D are arranged in parallel in the Y direction (see FIG. 10). By arranging in parallel a plurality of magnetic shields 131A~131D and 132A~132D in the Y direction, the magnetic shield 13 is less likely to become saturated.

Figure 17:
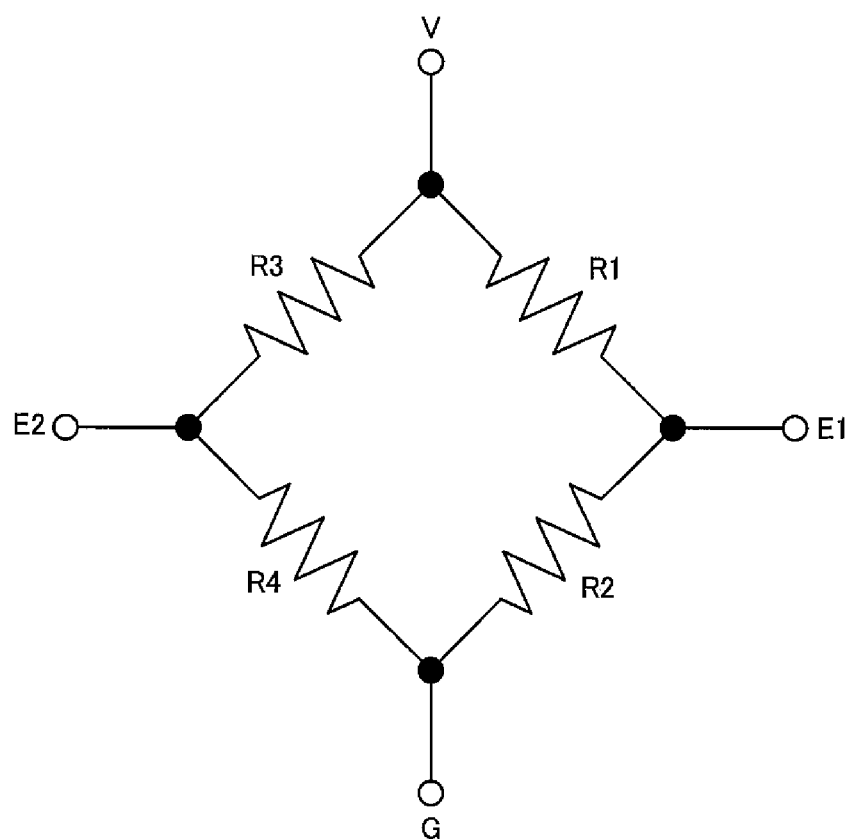
FIG. 17 is a circuit diagram showing the circuit configuration of the magnetic field detector according to one embodiment of the present invention.

The circuit configuration of the magnetic field detector 12 in this embodiment can be a Wheatstone bridge circuit in which four resistor units (first through fourth resistor units R1 R4) are bridge-connected (see FIG. 17). The circuit configuration of this magnetic field detector 12 may also be a half-bridge circuit in which two resistor units (for example, the first resistor unit R1 and the second resistor unit R2) are connected in series.

The Wheatstone bridge circuit includes a power source port V, a ground port G, a first output port E1, a second output port E2, the first resistor unit R1 provided between the power source port V and the first output port E1, the second resistor unit R2 provided between the first output port E1 and the ground port G, the third resistor unit R3 provided between the power source port V and the second output port E2, and the fourth resistor unit R4 provided between the second output port E2 and the ground port G. A power source voltage (constant current) of a prescribed magnitude is applied to the power source port V by a connected constant current source, and the ground port G is connected to ground. The constant current applied to the power source port V is controlled to a prescribed current value by an undepicted driver IC.

Figure 18:
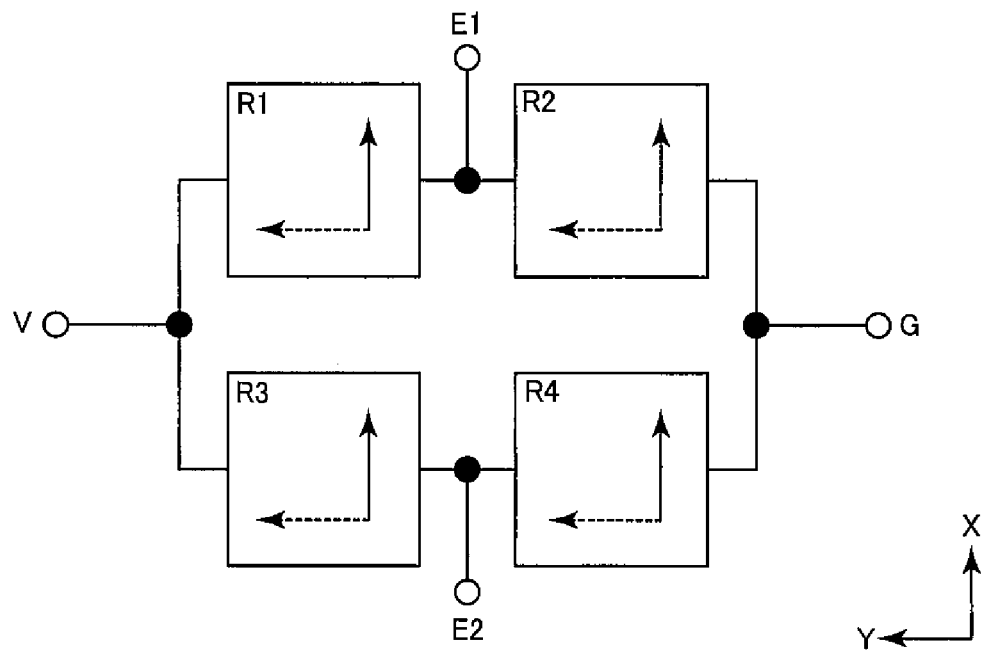
FIG. 18 is an explanatory diagram for explaining the magnetization directions in the initial state of the free layer and the magnetization fixed layer of the magnetoresistive effect element according to one embodiment of the present invention.

In this embodiment, the magnetization direction of the magnetization fixed layer 123 of all of the MR laminated bodies 125 (the solid arrows shown in FIG. 18 and FIG. 19) are fixed in the same direction (the +X direction) (see FIG. 18 and FIG. 19). The magnetization directions of the magnetization fixed layers in all the MR laminated bodies 125 should be fixed in roughly the same direction. In this case, the magnetization direction of the magnetization fixed layer 123 in each of the MR laminated bodies 125 should be inclined at an angle of 10° or less with respect to the +X direction. When viewed along the Z direction, all of the MR laminated bodies 125 have a shape that is long in the Y direction, so the free layer 121 in each of the MR laminated bodies 125 has shape anisotropy in which the easy magnetization axis direction is the Y direction. Consequently, the magnetization directions of the free layers 121 in all the MR laminated bodies 125 in the initial state (the state in which the second magnetic field component H2 is not applied) (the dashed arrows shown in FIG. 18) are the same. The magnetization directions are a direction (+Y direction) orthogonal to the magnetization direction of the magnetization fixed layer 123 (see FIG. 18). By the magnetization directions of the magnetization fixed layer 123 and the free layer 121 being the above-described directions, the electric potential difference between the first output port E1 and the second output port E2 changes accompanying changes in the resistance value of the first through fourth resistor units R1~R4 corresponding to the second magnetic field component H2, and a signal is output as this change in the electric potential difference.

In the magnetic sensor device according to this embodiment, when a magnetic field is generated from the first magnet 21, the first magnetic field component H1 parallel to the Z direction out of the partial magnetic fields that are one part of this magnetic field is input into the magnetic converter 11, is converted into the second magnetic field component H2 by the magnetic field converter 11 and is output. The second magnetic field component H2 in the −X direction is applied to the magnetoresistive effect elements 120 included in the first resistor unit R1 and the fourth resistor unit R4, and the magnetization direction of the free layer 121 changes accordingly. On the other hand, the second magnetic field component H2 in the +X direction is applied to the magnetoresistive effect elements 120 included in the second resistor unit R2 and the third resistor unit R3. Accordingly, the magnetization direction of free layer 121 changes (see FIG. 19). As a result, the angles θ1 and θ4 formed by magnetization of the free layer 121 and the magnetization fixed layer 123 in the first resistor unit R1 and the fourth resistor unit R4 exceed 90°. On the other hand, the angles θ2 and θ3 formed by magnetization of the free layer 121 and the magnetization fixed layer 123 in the second resistor unit R2 and the third resistor unit R3 become less than 90° (see FIG. 19). In FIG. 19, the dashed arrows indicate the magnetization of the free layer 121, the direction of which has changed through application of the second magnetic field component H2, and the white dashed arrows indicate the magnetization direction of the free layer 121 in the initial state.

The third magnetic field component H3, which is parallel to the Y direction, is included in the partial magnetic field that is a portion of the magnetic field generated from the first magnet 21. In this embodiment, the magnetic field transmittance of the third magnetic field component H3 is 1~30%, and preferably 3~10%. If the magnetic field transmittance of the third magnetic field component H3 is 1~30%, it is possible to make the linearity of the output from the magnetic sensor 10 be 1% or less. In this embodiment, the magnetic field transmittance is defined as the magnetic field strength of the third magnetic field component H3 applied to the magnetic field detector 12 as a percentage of the magnetic field strength of the third magnetic field component H3 generated from the first magnet 21. The magnetic field transmittance is, for example, a value that can be calculated using electromagnetic field analysis software (JMAG, made by JSOL), or the like. The linearity is defined as the amount of deviation of the output from the magnetic sensor 10 with respect to the relative position change amount of the magnetic sensor 10 and the first magnet 21, from the ideal line of this output. The aforementioned ideal line is a graph showing the ideal change in the output from the magnetic sensor 10 when the first magnet 21 is caused to move relatively in the ±Y direction from a state in which the geometric centers of both the magnetic sensor 10 and the first magnet 21 are caused to match in the Z direction (a graph showing the relationship between the relative position of the first magnet 21 and the output of the magnetic sensor 10), and is expressed as a linear function. The ideal change in the output means the change in output accompanying relative movement of the first magnet 21 in the case where the distribution of the magnetic field generated from the first magnet 21 is uniform. For example, the above-described linearity is calculated by superimposing a graph showing the change in the output from the magnetic sensor 10 when the first magnet 21 is caused to move relatively in the ±Y direction (a graph showing the relationship between the relative position of the first magnet 21 and the output of the magnetic sensor 10) on the above-described ideal line, finding the maximum value $\Delta V_{MAX}$ of the absolute value of the difference in the output of the magnetic sensor 10 between this graph and the ideal line, and the difference $\Delta V$ between the maximum value and the minimum value of the output of the magnetic sensor 10 (the output range of the magnetic sensor 10), and finding the ratio (%) of the maximum value $\Delta V_{MAX}$ of the absolute value of the difference in the outputs to this output range $\Delta V$.

Figure 14:
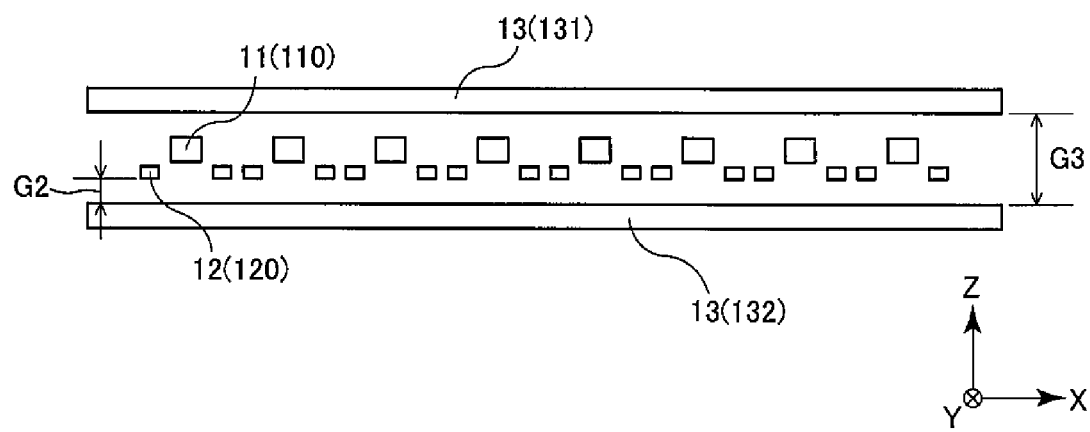
FIG. 14 is a side view showing a schematic configuration of a magnetic sensor according to one embodiment of the present invention.

In this embodiment, in order to keep the magnetic field transmittance of the third magnetic field component H3 within the above-described range, for example, the length G2 between the magnetic shield 13 and the magnetic field detector 12 in the Z direction (see FIG. 14), the length G3 between the first magnetic shield 131 and the second magnetic shield 132 in the Z direction (see FIG. 14) and the widths $W_{131}$ and $W_{132}$ of the plurality of first magnetic shields 131A~131D and/or the plurality of second magnetic shields 132A~132D arranged in parallel in the Y direction (the length in the Y direction; see FIG. 10) may be appropriately adjusted, or the relative permeability of the material that includes the magnetic shield 13 may be made relatively small, or at least one of the first magnetic shield 131 and the second magnetic shield 132 may be omitted.

In this embodiment, the length G2 between the magnetic shield 13 and the magnetic field detector 12 in the Z direction should be 0~10 and preferably 0~6 and more preferably 1~5 μm. If this length G2 is within the above-described range, it is possible to make the magnetic field transmittance of the third magnetic field component H3 be 1~30%. When the magnetic shield 13 includes the first magnetic shield 131 and the second magnetic shield 132, the above-described length G2 may be defined as the length between the magnetic field detector 12 and the magnetic shield (the second magnetic shield 132 in FIG. 14) closest to the magnetic field detector 12.

In this embodiment, when the magnetic shield 13 includes the first magnetic shield 131 and the second magnetic shield 132, the length G3 of the gap between the first magnetic shield 131 and the second magnetic shield 132 in the Z direction may have the relationship with the above-described length G2 shown in the below equation. By having the above-described length G3 have the relationship shown in the below equation, it is possible to keep the magnetic field transmittance of the third magnetic field component H3 at 1~30%. The above-described length G3 should be 1~40 μm, and preferably is 4~15 μm.

$$\frac{(G2-9)^2}{8^2} + \frac{(G3-40)^2}{25^2} \geqq 1 \qquad \text{[Formula 1]}$$

In this embodiment, the width $W_{131}$ or $W_{132}$ (length in the Y direction) of the plurality of first magnetic shields 131A~131D and/or the plurality of second magnetic shields 132A~132D, which are arranged in parallel in the Y direction, is preferably 12 μm or greater, and more preferably is 17~40 μm. If the widths $W_{131}$ and $W_{132}$ are within the above-described range, it is possible to keep the magnetic field transmittance of the third magnetic field component H3 at 1~30%. When the widths $W_{131}$ and $W_{132}$ exceed 50 μm, there is a concern that the first magnetic shields 131A~131D or the second magnetic shields 132A~132D will become saturated.

In this embodiment, the relative permeability of the constituent material of the magnetic shield 13 is preferably 200~18000, and more preferably 1000~10000. If the relative permeability is within the above-described range, it is possible for the magnetic shield 13 to absorb a portion of the third magnetic field component H3, and it is possible to keep the magnetic field transmittance of the third magnetic field component H3 at 1~30%.

In this embodiment, the magnetic field strength of the third magnetic field component H3 generated from the first magnet 21 is 200 mT or greater, and the magnetic field transmittance is 1~30%. Consequently, a portion of the third magnetic field component H3 (the third magnetic field component H3 having a magnetic field strength of 2~60 mT) is applied to the magnetoresistive effect elements 120. Because the magnetization direction of the free layer 121 is the same as the direction at which the third magnetic field component H3 is applied, when the second magnetic field component H2 is applied to the magnetoresistive effect elements 120, it is difficult for the magnetization direction of the free layer 121 to change, the sensitivity of the magnetic sensor 10 decreases and the output from the magnetic sensor 10 is reduced. On the other hand, the electric current value applied to the magnetic field detector 12 from the driver IC is adjusted in order to control drops in the sensitivity of the magnetic sensor 10 and increase the output from the magnetic sensor 10, but due to variation in the length G1 of the gap between the magnetic sensor 10 and the first magnet 21, the output from the magnetic sensor 10 can become too large or be insufficient. In this embodiment, by having the magnetic field transmittance of the third magnetic field component H3 with a magnetic field strength of 200 mT or greater be 1~30%, it is possible to set the output from the magnetic sensor 10 within an appropriate range despite variation in the length G1 of the gap between the magnetic sensor 10 and the first magnet 21. In addition, it is possible to make the linearity of the output from the magnetic sensor 10 good. Hence, with this embodiment, it is possible to improve the detection accuracy of the magnetic sensor device even if variation in the length G1 arising at the time of assembly of the magnetic sensor 10 and the first magnet 21 occurs.

The above-described embodiment was disclosed in order to facilitate understanding of the present invention and was not disclosed in order to limit the present invention. Accordingly, all elements disclosed in the above-described embodiment shall be construed to include all design modifications and equivalents falling within the technical scope of the present invention.

Embodiments

Below, the present invention will be described in greater detail by presenting embodiments or the like, but the present invention is in no way limited by the below-described embodiments or the like.

Test Example 1

Figure 10:
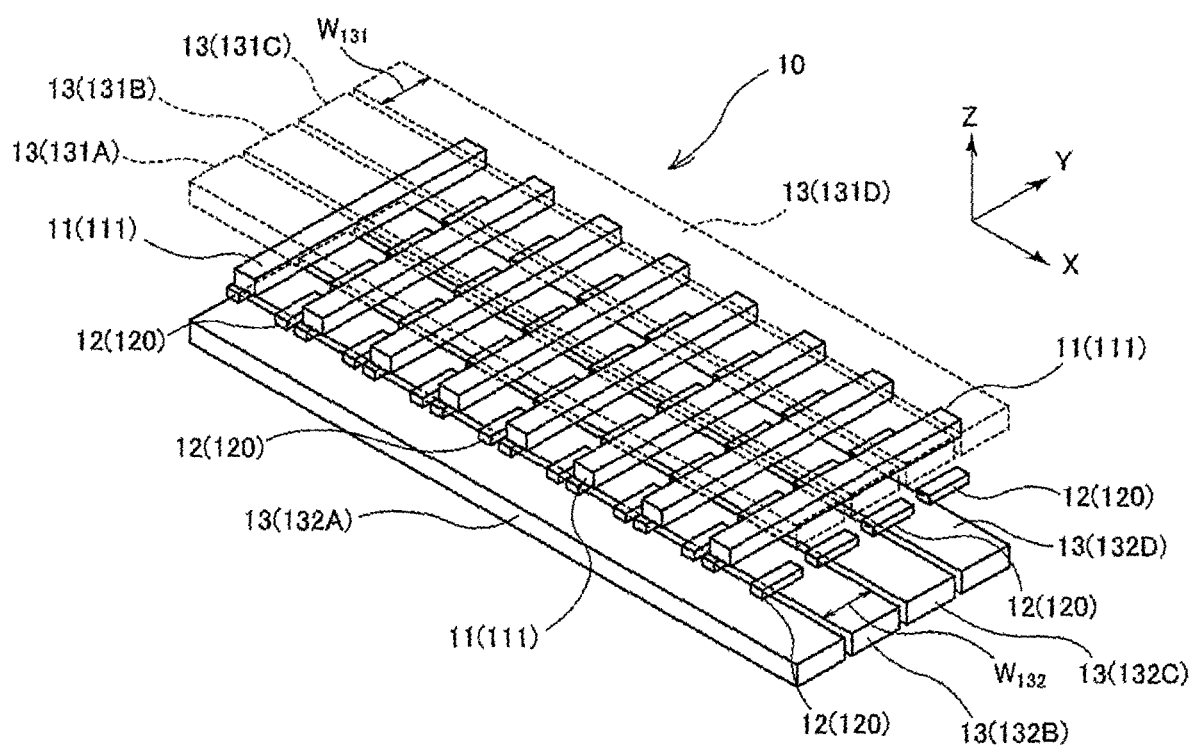
FIG. 10 is a perspective view showing a schematic configuration of a magnetic sensor according to one embodiment of the present invention.
Figure 11:
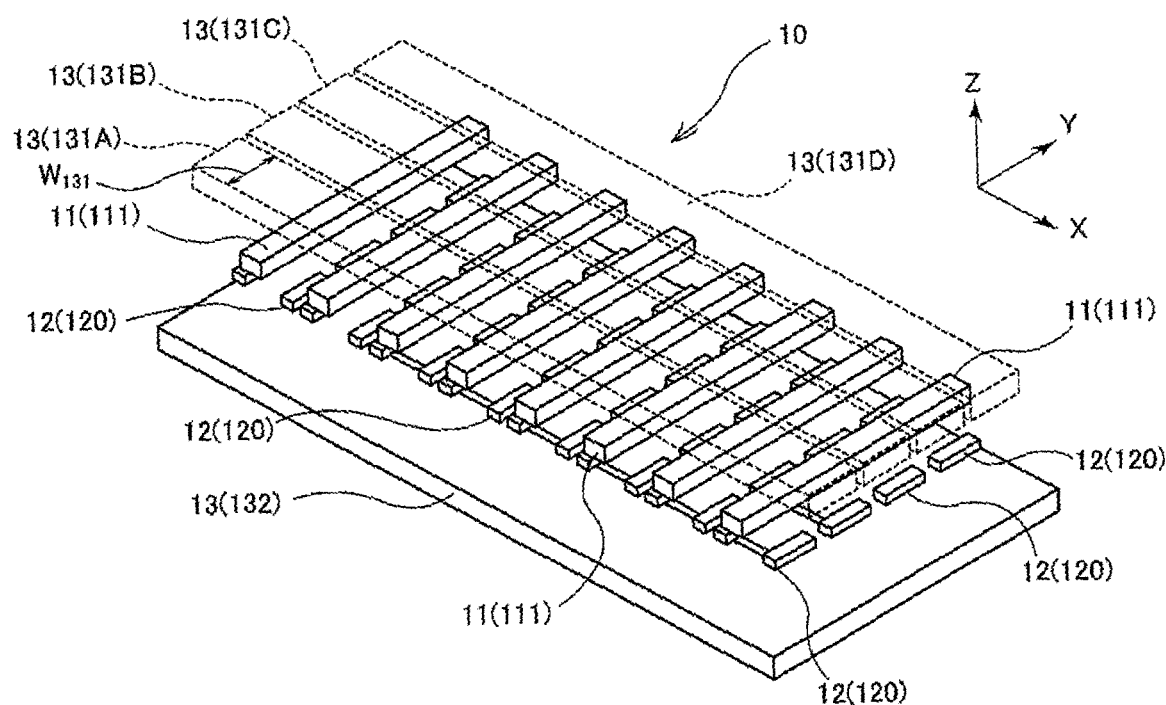
FIG. 11 is a perspective view showing a schematic configuration of a magnetic sensor according to one embodiment of the present invention.
Figure 12:
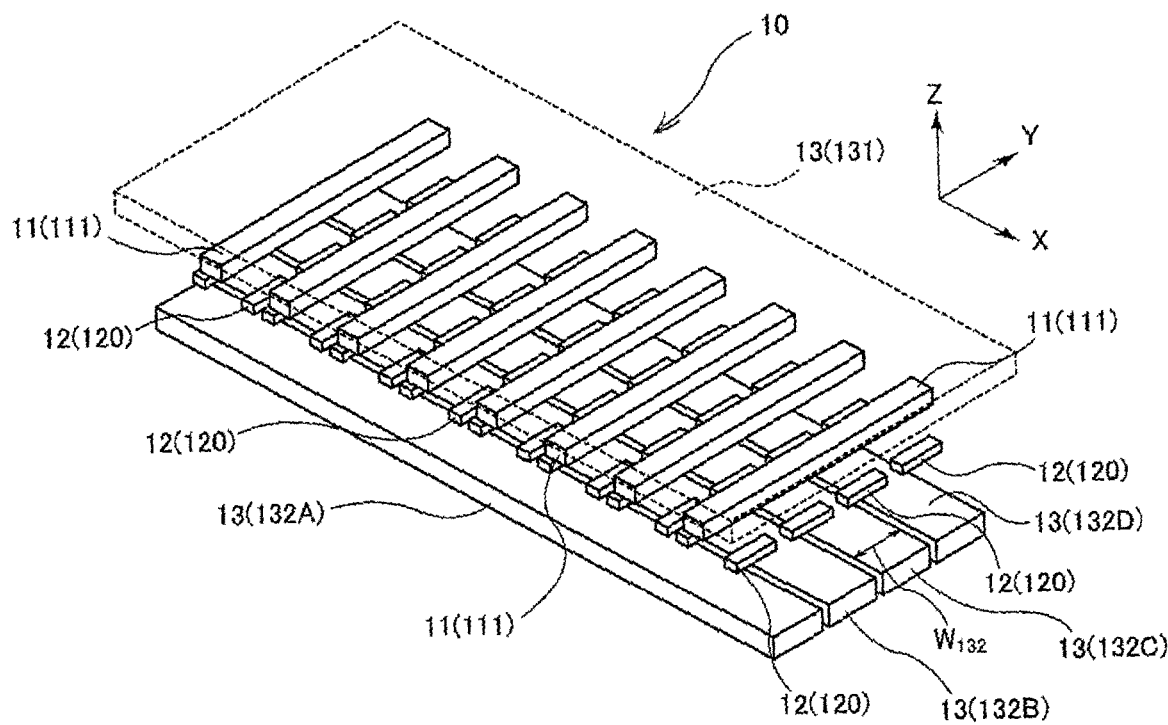
FIG. 12 is a perspective view showing a schematic configuration of a magnetic sensor according to one embodiment of the present invention.
Figure 20:
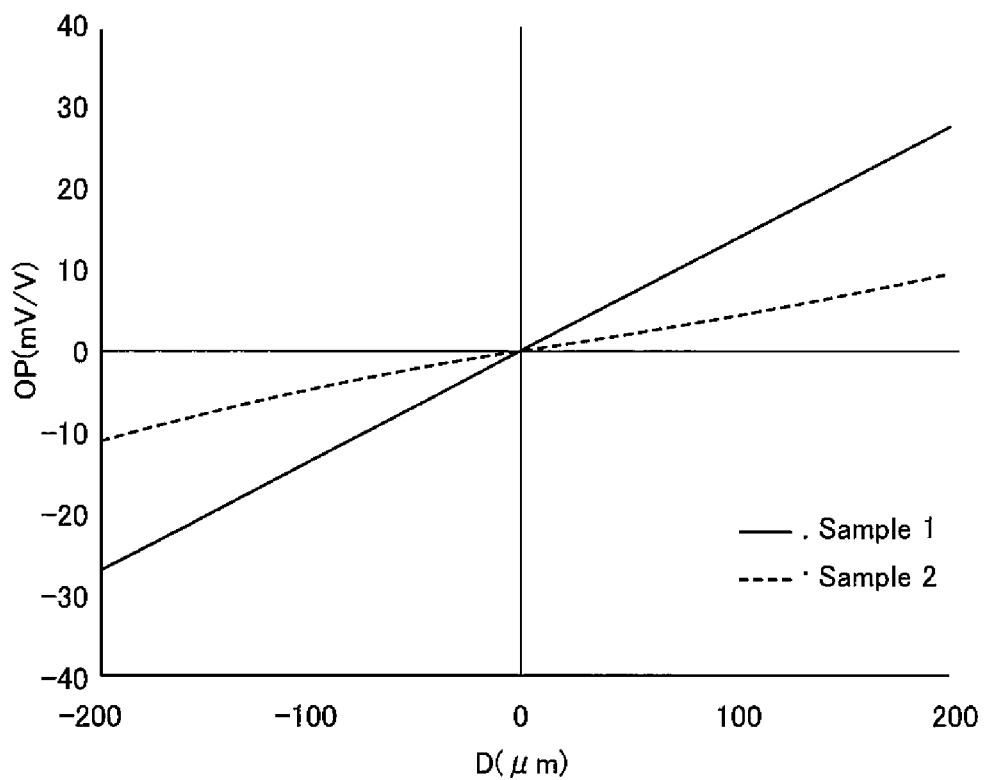
FIG. 20 is a graph showing the results of Test Example 1.

Using the magnetic sensor 10 (Sample 1) having the configuration shown in FIG. 10, fluctuation in the output of the magnetic sensor 10 when the length G1 of the gap between the first magnet 21 and the magnetic sensor 10 is caused to fluctuate in the +Z direction and the −Z direction from an initial state was calculated through simulations. In Sample 1, the length G1 of the gap between the first magnet 21 and the magnetic sensor 10 in the aforementioned initial state was taken to be 0.5 mm, the magnetic field strength of the third magnetic field component H3 was taken to be 200 mT, and the magnetic field transmittance of the third magnetic field component H3 was taken to be 10%. Similarly, fluctuation in the output of the magnetic sensor 10 was calculated through simulations using one magnetic sensor 10 (Sample 2) not having a magnetic shield 13 (first magnetic shield 131 and second magnetic shield 132). The results are shown in FIG. 20. In FIG. 20, the horizontal axis of the graph shows the fluctuation distance (D) in the +Z direction and −Z direction from a predetermined position, and the vertical axis shows the output (OP) of the magnetic sensor 10. Zero on the horizontal axis (D) shows the aforementioned predetermined position, and the vertical axis (OP) shows the difference between the output of the magnetic sensor 10 when the distance between the first magnet 21 and the magnetic sensor 10 has fluctuated, and the output of the magnetic sensor 10 at the predetermined position. In addition, in Sample 1, the magnetic field strength of the third magnetic field component H3 applied to the magnetic sensor 10 is taken as 10% of the magnetic field strength of the third magnetic field component H3 generated from the first magnet 21, and in Sample 2, the magnetic field strength of the third magnetic field component H3 applied to the magnetic sensor 10 is taken as 100% of the magnetic field strength of the third magnetic field component H3 generated from the first magnet 21. Furthermore, in Sample 1 and Sample 2, the magnetic field strength of the second magnetic field component H2 generated from the first magnet 21 was taken to be ±100 mT (millitesla), the magnetic field strength of the second magnetic field component H2 was taken to be 15% of the magnetic field strength of the first magnetic field component H1, and the sensitivity of the magnetic sensor 10 was taken to be 100 (mV/V/deg).

In the graph shown in FIG. 20, the results of Sample 1 are expressed by the solid line, and the results of Sample 2 are expressed by the dashed line. As is clear from the results shown in FIG. 20, in the magnetic sensor 10 of Sample 1, it is possible to obtain a larger output than in the magnetic sensor 10 of Sample 2. From this, it can be conjectured that the sensitivity of the magnetic sensor 10 decreases due to the third magnetic field component H3 being applied to the magnetic sensor 10. By having a magnetic shield 13 capable of absorbing the third magnetic field component H3 as in the magnetic sensor 10 of Sample 1, it can be said that it is possible to control drops in the sensitivity of the magnetic sensor 10. On the other hand, when the sensitivity of the magnetic sensor 10 decreases due to the third magnetic field component H3, as in Sample 2, it is necessary to greatly amplify the output of the magnetic sensor 10, but when the output of the magnetic sensor 10 is greatly amplified, the problem arises that noise included in the output of the magnetic sensor 10 also becomes larger. In addition, in Sample 2, the linearity is 1.4%, so it is necessary to further increase this linearity.

Test Example 2

Figure 21:
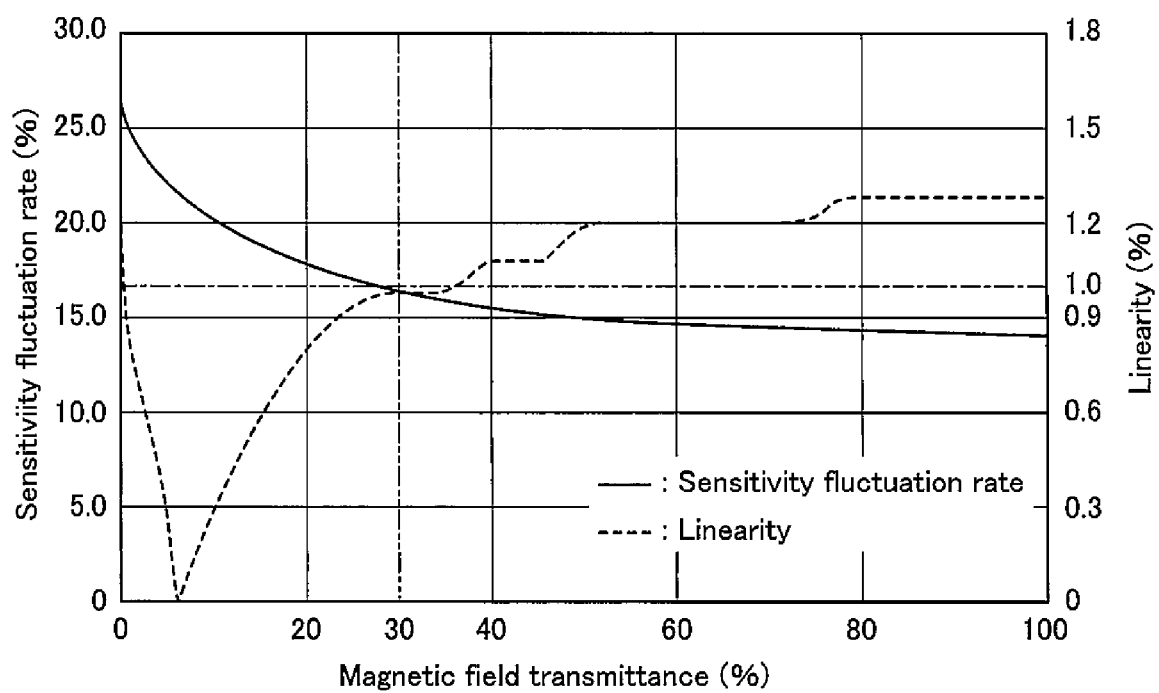
FIG. 21 is a graph showing the results of Test Example 2.

In the magnetic sensor 10 of above-described Sensor 1, the sensitivity fluctuation rate (%) and linearity (%) of the magnetic sensor 10 when the magnetic field transmittance (%) of the third magnetic field component H3 was caused to fluctuate were calculated through simulations. Results are shown in FIG. 21. The sensitivity fluctuation rate (%) is the value of the fluctuation rate (%) of the sensitivity (S2) when the length G1 of the gap between the first magnet 21 and the magnetic sensor 10 is caused to fluctuate, taking as a standard the sensitivity (S1) when the aforementioned G1 length is in an initial state (0.5 mm), and is calculated from the below equation.

$$\text{Sensitivity fluctuation rate (\%)} = (S1-S2)/S1 \times 100$$

In the graph shown in FIG. 21, the sensitivity fluctuation rate (%) is expressed by the solid line, and the linearity (%) is expressed by the dashed line. As shown in FIG. 21, when the magnetic field transmittance (%) of the third magnetic field component H3 was 1~30%, it was possible to control decreases in the sensitivity of the magnetic sensor 10, and it was confirmed that the linearity became 1.0% or less.

Test Example 3

In the magnetic sensor 10 of above-described Sample 1, the magnetic field transmittance (%) when the width $W_{131}$ of the first magnetic shield 131 and the width $W_{132}$ of the second magnetic shield 132 were caused to fluctuate within a range of 10~50 μm was calculated using electromagnetic field analysis software (JMAG, made by JSOL). Results are shown in FIG. 22.

Figure 22:
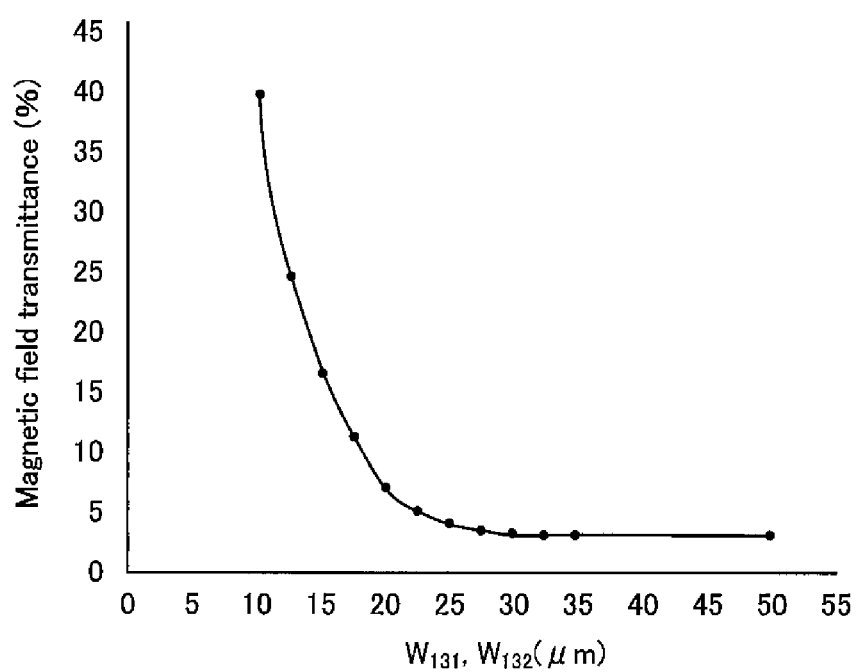
FIG. 22 is a graph showing the results of Test Example 3.

As is clear from the results shown in FIG. 22, by making the width $W_{131}$ of the first magnetic shield 131 and the width $W_{132}$ of the second magnetic shield 132 be 12 μm or greater, it was possible to keep the magnetic field transmittance at 30% or less.

DESCRIPTION OF SYMBOLS

10 Magnetic sensor
11 Magnetic field converter
111 Yoke
12 Magnetic field detector
120 Magnetoresistive effect element
13 Magnetic shield
131 First magnetic shield
132 Second magnetic shield

The invention claimed is:

1. A magnetic sensor device comprising:
a magnetic field converter that receives an input magnetic field input along a first direction and outputs an output magnetic field along a second direction, which is orthogonal to the first direction;
a magnetic field detector provided at a position where the output magnetic field can be applied; and
a magnetic shield that shields external magnetic fields along a third direction, which is orthogonal to both the first direction and the second direction;
wherein the magnetic field converter is made of a soft magnetic material;
when viewed along the first direction, the magnetic field converter has a shape such that a length in the third direction is greater than a length in the second direction;
when viewed along the first direction, the magnetic shield is provided at a position overlapping the magnetic field converter and the magnetic field detector; and
a magnetic field transmittance of the external magnetic field is 1~30%.

2. The magnetic sensor device according to claim 1, wherein when viewed along the first direction, the magnetic shield has a shape such that a maximum length in the third direction is less than a maximum length in the second direction.

3. The magnetic sensor device according to claim 1, wherein a linearity of a sensor signal output from the magnetic sensor device in accordance with a magnetic field strength of the output magnetic field is 1% or less.

4. The magnetic sensor device according to claim 1, wherein a length of a gap between the magnetic field detector and the magnetic shield in the first direction is 0~10 μm.

5. The magnetic sensor device according to claim 1, wherein a plurality of the magnetic shields is arranged in parallel along the third direction.

6. The magnetic sensor device according to claim 1, wherein the magnetic shield includes a first magnetic shield and a second magnetic shield;
the magnetic field converter and the magnetic field detector are provided in a gap between the first magnetic shield and the second magnetic shield in the first direction; and
a length of the gap between the first magnetic shield and the second magnetic shield in the first direction is 1~40 μm.

7. The magnetic sensor device according to claim 1, wherein when viewed along the first direction, the magnetic shield is positioned to a front side or a back side of the magnetic field converter and the magnetic field detector.

8. The magnetic sensor device according to claim 1, further comprising a plurality of magnetic field detectors;
wherein when viewed along the first direction, the plurality of magnetic field detectors is provided at a position that is line-symmetrical about an axis along a lengthwise direction of the magnetic field converter, wherein the axis passes through the center of a magnetic field converter in a short-wise direction.

9. The magnetic sensor device according to claim 1, wherein the magnetic field detector includes a magnetoresistive effect element; and
the magnetoresistive effect element includes a magnetization fixed layer, in which the magnetization is fixed, and a magnetization free layer, a magnetization direction of which changes in accordance with the output magnetic field that is applied.

10. The magnetic sensor device according to claim 1, wherein the magnetic field detector includes a tunnel magnetoresistance effect (TMR) element or a giant magnetoresistance effect (GMR) element.

* * * * *